United States Patent
Lee et al.

(10) Patent No.: US 8,592,988 B2
(45) Date of Patent: Nov. 26, 2013

(54) SEMICONDUCTOR DEVICE

(75) Inventors: Ho-Jin Lee, Yeongdeungpo-gu (KR);
Sung-Dong Cho, Hwaseong-si (KR);
Se-Young Jeong, Suwon-si (KR);
Yeong-Lyeol Park, Yongin-si (KR);
Sin-Woo Kang, Yeongdeungpo-gu (KR)

(73) Assignee: Samsung Electronics Co., Ltd.,
Gyeonggi-Do (KR)

( * ) Notice: Subject to any disclaimer, the term of this patent is extended or adjusted under 35 U.S.C. 154(b) by 153 days.

(21) Appl. No.: 13/186,049

(22) Filed: Jul. 19, 2011

(65) Prior Publication Data
US 2012/0056330 A1    Mar. 8, 2012

(30) Foreign Application Priority Data
Sep. 7, 2010    (KR) .................. 10-2010-0087233

(51) Int. Cl.
*H01L 23/48*    (2006.01)
(52) U.S. Cl.
USPC .................................. 257/773; 257/E23.011
(58) Field of Classification Search
USPC .................... 257/773, 774, E23.011
See application file for complete search history.

(56) References Cited

U.S. PATENT DOCUMENTS

| 7,253,527 | B2* | 8/2007 | Tanida et al. | 257/774 |
| 7,510,968 | B2* | 3/2009 | Lee et al. | 438/667 |
| 2007/0161235 | A1 | 7/2007 | Trezza | |

FOREIGN PATENT DOCUMENTS

| JP | 2004342690 A | 12/2004 |
| KR | 100599088 B1 | 7/2006 |

* cited by examiner

*Primary Examiner* — Mark Prenty
(74) *Attorney, Agent, or Firm* — Harness, Dickey & Pierce, P.L.C.

(57) ABSTRACT

A semiconductor device may include a substrate and a through electrode. The substrate may have a first surface and a second surface opposite to the first surface, the substrate including circuit patterns formed on the first surface. The through electrode penetrates the substrate and may be electrically connected to the circuit pattern, the through electrode including a first plug that extends from the first surface in a thickness direction of the substrate and a second plug that extends from the second surface in the thickness direction of the substrate so as to be connected to the first plug.

11 Claims, 28 Drawing Sheets

SEMICONDUCTOR DEVICE

PRIORITY STATEMENT

This application claims priority under 35 U.S.C. §119 to Korean Patent Application No. 10-2010-0087233, filed on Sep. 7, 2010 in the Korean Intellectual Property Office (KIPO), the entire contents of which are herein incorporated by reference.

BACKGROUND

1. Field

Example embodiments relate to a semiconductor device and a method of manufacturing a semiconductor device. More particularly, example embodiments relate to a semiconductor device having a through electrode in a semiconductor substrate and/or a method of manufacturing the semiconductor device.

2. Description of the Related Art

As device speeds and device integration increase, signal delays may also be increased, for example, due to parasitic capacitance introduced by interconnection structures. Advances in integration technology have led to the development of three-dimensional integration, where wafers may be stacked three-dimensionally, in contrast to the conventional two-dimensional approach.

In a three-dimensional wafer stack package (WSP), a technique called through-silicon via (TSV) can be used to extend the via hole through a substrate so that a conductive via for a through electrode may be formed to vertically extend and completely penetrate through the substrate. Such a TSV structure may provide higher speeds, higher integration, and may improve functionality in comparison to a long wire pattern interconnection. For example, the conductive via may be formed using copper (Cu) having a relatively low resistance. However, copper is known to have a relatively high diffusivity in silicon.

Conventionally, the TSV may be formed through the substrate before back end processing. In particular, the TSV structure may be formed by forming an opening or hole in a substrate, such as a silicon substrate. An insulation layer may be formed on the substrate and in the opening. A conductive metal layer, such as a copper layer (Cu), may be formed in the opening, for example, by a plating process or deposition process. A backside of the substrate may then be recessed to expose at least a portion of the conductive metal layer, thereby forming a conductive via extending through the substrate. In this case, the substrate including the conductive via may be exposed repeatedly during processes such as an etch process. Especially, when the portion of the conductive metal layer is exposed during an etch process, the metal of the conductive metal layer such as copper may diffuse into the substrate, thereby deteriorating a semiconductor device such as a semiconductor chip. Further, a thermal stress may occur due to a thermal expansion difference between the metal and the substrate. Thus, it may be relatively difficult to form the opening having a desired aspect ratio in the substrate.

SUMMARY

Some example embodiments relate to a semiconductor device having a through electrode with a desired aspect ratio.

Some example embodiments relate to a semiconductor package including the semiconductor device.

Some example embodiments relate to methods of manufacturing the semiconductor device.

According to an example embodiment, a semiconductor device may include a substrate and a through electrode. The substrate may have a first surface and a second surface opposite to the first surface, the substrate including circuit patterns formed on the first surface. The through electrode may penetrate the substrate and be electrically connected to the circuit pattern, the through electrode including a first plug that extends from the first surface in a thickness direction of the substrate and a second plug that extends from the second surface in the thickness direction of the substrate so as to be connected to the first plug.

In example embodiments, the semiconductor device may further include an upper wiring layer on the first surface of the substrate, and the upper wiring layer may include wirings that are electrically connected to the circuit patterns.

In example embodiments, at least one of the wirings may make contact with an upper surface of the first plug.

In example embodiments, the first plug may penetrate the upper wiring layer.

In example embodiments, the first plug may have a first diameter and the second plug may have a second diameter that is greater than the first diameter.

In example embodiments, the diameter of the second plug may be gradually decreased from the second surface in the thickness direction of the substrate.

In example embodiments, the second plug may include a recess in an upper portion thereof.

According to example embodiments, a semiconductor package may include a first semiconductor chip, a bump, and a second semiconductor chip. The first semiconductor chip may include a substrate having a first surface and a second surface opposite to the first surface and having circuit patterns formed on the first surface, and a through electrode penetrating the substrate and electrically connected to the circuit pattern, the through electrode including a first plug that extends from the first surface in a thickness direction of the substrate and a second plug that extends from the second surface in the thickness direction of the substrate so as to be connected to the first plug. The bump may be provided on the second plug. The second semiconductor chip may be stacked on the first semiconductor chip so as to be electrically connected to the first semiconductor chip by the bump.

In example embodiments, the first plug may have a first diameter and the second plug may have a second diameter that is greater than the first diameter.

In example embodiments, the second plug may include a recess in an upper portion thereof, and the bump may be disposed in the recess of the second plug.

According to example embodiments, in a method of manufacturing a semiconductor device, a substrate having a first surface and a second surface opposite to the first surface may be prepared. The substrate may include circuit patterns formed on the first surface. A first plug may be formed so as to extend from the first surface in a thickness direction of the substrate. Before or after forming the first plug, an upper wiring layer may be formed on the first surface of the substrate. The upper wiring layer may include wirings that electrically connect the circuit pattern and the first plug. A second plug may be formed to extend from the second surface in the thickness direction of the substrate so as to be connected to the first plug.

In example embodiments, forming the upper wiring layer after forming the first plug may include forming at least one of the wirings so as to make contact with an upper surface of the first plug.

In example embodiments, fondling the upper wiring layer before forming the first plug may include fanning the upper wiring layer on the first surface of the substrate. The upper wiring layer may include wirings that are electrically connected to the circuit patterns. The first plug may penetrate the upper wiring layer.

In example embodiments, the method may further include planarizing the second surface of the substrate to control the thickness of the substrate after forming the first plug.

In example embodiments, forming the second plug may include forming an opening that extends from the second surface in the thickness direction of the substrate to expose a lower surface of the first plug, and forming a conductive pattern in the opening so as to be connected to the first plug.

In example embodiments, the conductive pattern may completely fill the opening.

In example embodiments, the conductive pattern may alternatively be formed conformally along the profile of the opening so as to only partially fill the opening.

In example embodiments, the conductive pattern may include a recess in an upper portion thereof.

In example embodiments, the diameter of the opening may be gradually decreased from the second surface in the thickness direction of the substrate.

In example embodiments, the opening may expose a lower sidewall of the first plug.

In example embodiments, the first plug may have a first diameter and the second plug may have a second diameter that is greater than the first diameter.

According to example embodiments, before or after a first plug is formed to extend from a first surface in a thickness direction of a substrate, a wiring process (BEOL process) may be performed to form an upper wiring layer including wirings that electrically connect the first plug to circuit patterns on the first surface of the substrate. A second plug may be formed to extend from the second surface in the thickness direction of the substrate so as to be connected to the first plug.

Accordingly, a thermal stress to a through electrode under a relatively high temperature of the BEOL process may be reduced. In addition, the resultant through electrode may be formed to have a desired length. Further, costs for forming the through electrode may be reduced, and during the manufacturing processes, a conductive material such as copper may be prevented from diffusing into the substrate.

BRIEF DESCRIPTION OF THE DRAWINGS

Example embodiments will be more clearly understood when the following detailed description is taken in conjunction with the accompanying drawings.

FIG. 1 is a cross-sectional view illustrating a semiconductor device in accordance with a non-limiting example embodiment.

FIG. 2 is a view illustrating a semiconductor package including the semiconductor device in the FIG. 1.

FIG. 3 is an enlarged view illustrating the "A" portion in FIG. 2.

FIGS. 4 to 12 are cross-sectional views illustrating a method of manufacturing the semiconductor device in FIG. 1.

FIG. 13 is a cross-sectional view illustrating a semiconductor device in accordance with another non-limiting example embodiment.

FIG. 14 is a cross-sectional view illustrating a portion of a semiconductor package including the semiconductor device in the FIG. 13.

FIGS. 15 to 22 are cross-sectional views illustrating a method of manufacturing the semiconductor device in FIG. 13.

FIGS. 23 to 29 are cross-sectional views illustrating various shapes for a plug of a through electrode.

DETAILED DESCRIPTION

Figure 1:
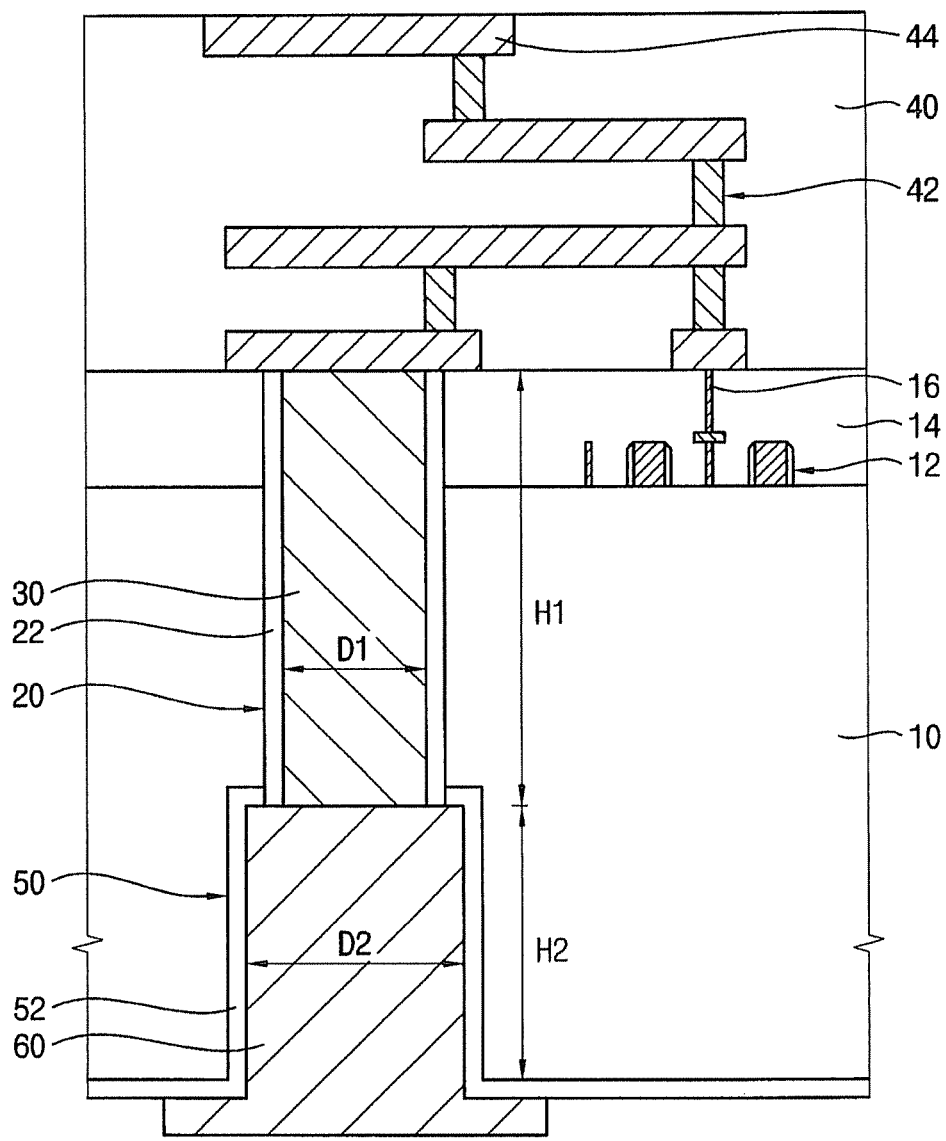
FIGS. 1 to 29 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in further detail with reference to the accompanying drawings.

FIG. 1 is a cross-sectional view illustrating a semiconductor device in accordance with a non-limiting example embodiment.

Referring to FIG. 1, a first semiconductor device 100 according to a non-limiting example embodiment includes a substrate 10 and a through electrode penetrating the substrate 10. The through electrode includes a first plug 30 and a second plug 60 that are connected to each other.

In an example embodiment, the substrate may include a first surface and a second surface opposite to the first surface. Circuit patterns 12 may be provided on the first surface of the substrate 10. For example, the substrate 10 may be a single-crystalline silicon substrate. The circuit pattern 12 may include a transistor, a diode, a capacitor, etc. The circuit patterns 12 may constitute circuit elements. Accordingly, the first semiconductor device 100 may be a semiconductor chip including a plurality of the circuit elements formed therein.

The circuit element may include a plurality of memory devices. Examples of the memory devices may include a volatile memory device and a non-volatile memory device. Examples of the volatile memory device may include a DRAM, SRAM, etc. Examples of the non-volatile memory device may include a EPROM, EEPROM, Flash EEPROM, etc.

An insulation interlayer 14 may be provided on the substrate 10 to cover the circuit patterns 12. The circuit patterns 12 may be electrically connected to lower wirings 16. The lower wiring 16 may include polysilicon or a metal.

A first opening 20 and a second opening 50 connected to the first opening 20 may be provided in the substrate 10. The first opening 20 may be provided to penetrate the insulation interlayer 14. The first opening 20 may extend from the first surface of the substrate 10 in a thickness direction of the substrate 10. The second opening 50 may extend from the second surface of the substrate 10 in the thickness direction of the substrate 10 so as to be connected to the first opening 20.

A first insulation layer pattern 22 may be provided on the inner walls of the first opening 20 and a second insulation layer pattern 52 may be provided on the inner walls of the second opening 50. The first and second insulation layer patterns 22 and 52 may insulate the substrate 10 from conductive materials within the first and second openings 20 and 50.

The first plug 30 may be provided on the first insulation layer pattern 22 so as to fill the first opening 20. Similarly, the second plug 60 may be provided on the second insulation layer pattern 52 so as to fill the second opening 50.

The first and second plugs 30 and 60 may include copper (Cu), aluminum (Al), gold (Au), indium (In), nickel (Ni), etc. These elements may be used alone or in a mixture thereof. For example, the plug may include copper (Cu). Accordingly, a through plug including the first and second plugs 30 and 60 may be provided within the first and second openings 20 and 50.

Although not illustrated, barrier layer patterns may be provided on the first and second insulation layer patterns 22 and 52, respectively. The barrier layer may include a metal such as tantalum (Ta), titanium (Ti), ruthenium (Ru), cobalt (Co), Nickel (Ni) and tungsten (W), or a metal nitride. These elements may be used alone or in a mixture thereof.

The first plug 30 may have a first height (H1) and a first diameter (D1). The second plug 60 may have a second height (H2) and a second diameter (D2). In a non-limiting example embodiment, the second diameter (D2) of the second plug 60 may be greater than the first diameter (D1) of the first plug 30. The heights of the first and second plugs 30 and 60 may be selected based on the thickness of the substrate 10, a desired aspect ratio, a thermal expansion coefficient of the conductive material in the opening, a process temperature, and so on. For example, the height of the first and second plugs 30 and 60 may range from about 10 μm to about 100 μm, and the diameter of the first and second plugs 30 and 60 may range from about 1 μm to about 15 μm.

An upper wiring layer 40 may be provided on the insulation interlayer 14 on the substrate 10. Wirings 42 may be formed in the upper wiring layer 40 so as to be electrically connected to the circuit patterns 12. At least one of the wirings 42 may make contact with an upper surface of the first plug 30. The uppermost wiring 44 of the wiring 42 may be provided for an external interconnection.

The upper wiring layer 40 may be an inter-metal dielectric (IMD) layer including a plurality of wirings 42 formed therein. The IMD layer may include a material having a relatively low dielectric constant. The upper wiring layer 40 may include silicon oxide, carbon-doped silicon oxide, etc.

Although not illustrated, a buffer layer pattern may be interposed between the insulation interlayer 14 and the upper wiring layer 40. The buffer layer may prevent the conductive material of the first plug 30 from diffusing into the substrate 10. The buffer layer pattern may include silicon nitride.

Figure 2:
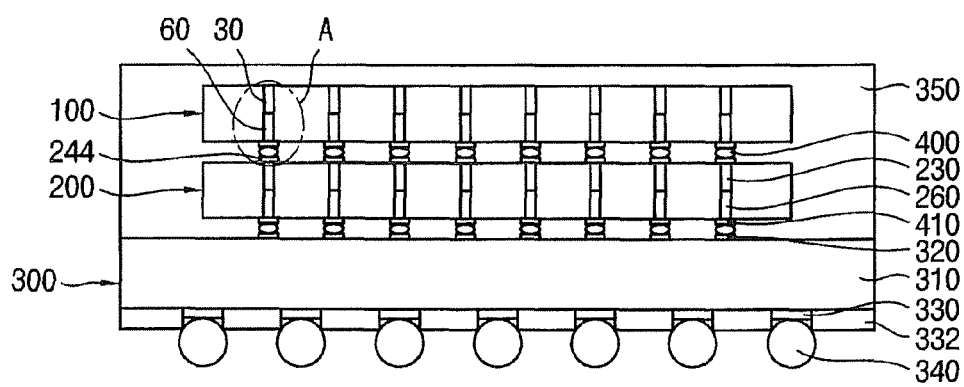
Figure 3:
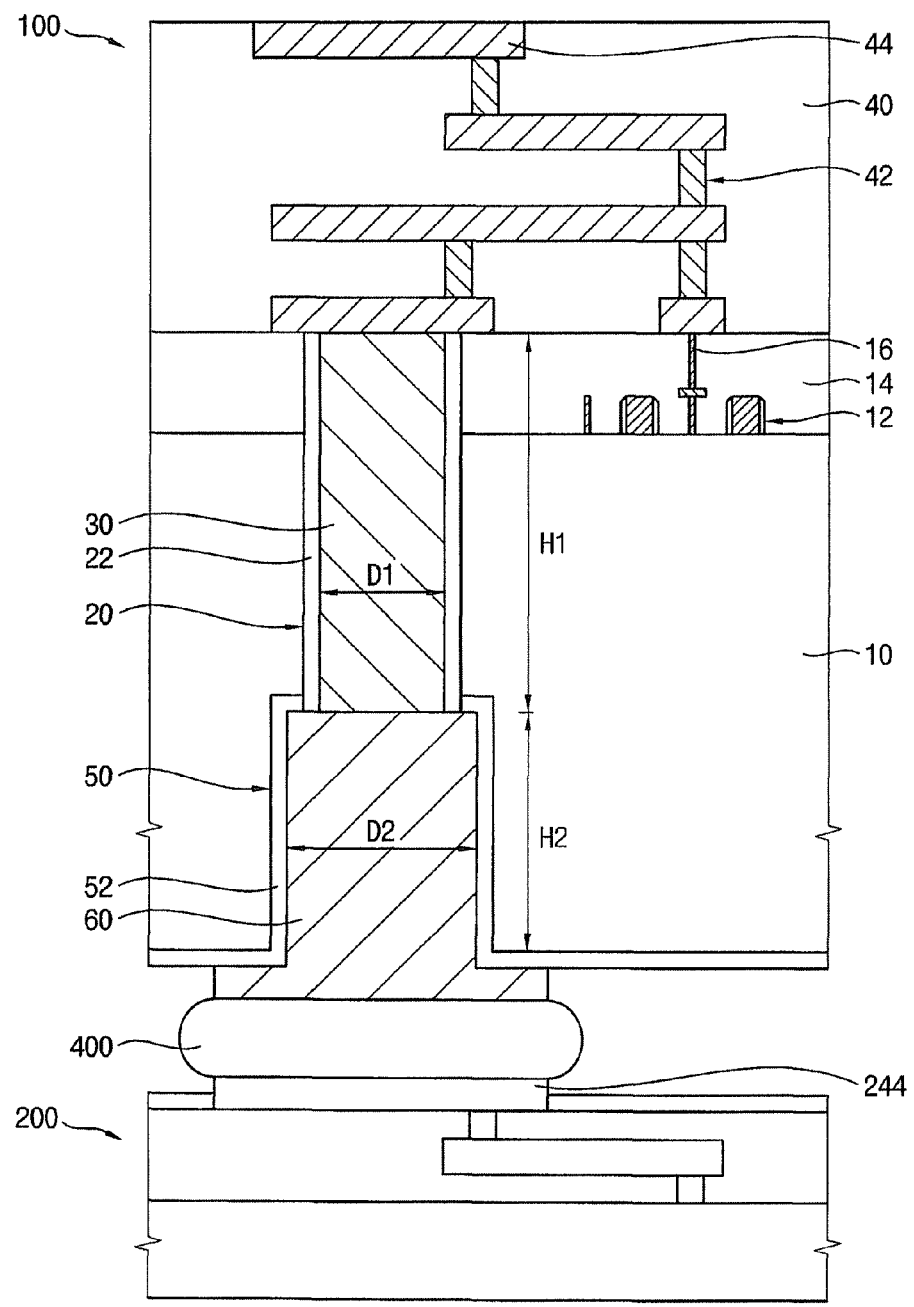

FIG. 2 is a view illustrating a semiconductor package including the semiconductor device in the FIG. 1. FIG. 3 is an enlarged view illustrating the "A" portion in FIG. 2.

Referring to FIGS. 2 and 3, a semiconductor package according to a non-limiting example embodiment includes a mounting substrate 300, first and second semiconductor devices 100 and 200, and first and second bumps 400 and 410 for electrically connecting the first and second semiconductor devices 100 and 200 to the mounting substrate 300. The first and second semiconductor devices 100 and 200 may be semiconductor chips.

In a non-limiting example embodiment, the mounting substrate 300 may include a substrate 310 having an upper surface and a lower surface opposite to each other. For example, the substrate 310 may be a printed circuit board (PCB). The PCB may include a multilayered circuit board having various circuits and vias therein.

Connection pads 320 may be formed on the upper surface of the substrate 310 and outer connection pads 330 may be formed on the lower surface of the substrate 310. The connection pad 320 may be exposed by an insulation layer pattern (not illustrated) and the outer connection pad 330 may be exposed by an insulation layer pattern 332.

The second semiconductor device 200 may be mounted on the mounting substrate 300. The second semiconductor device 200 may be mounted on the mounting substrate 300 using a plurality of the second bumps 410 so as to be electrically connected to the mounting substrate 300. The first semiconductor device 100 may be stacked on the second semiconductor device 200 using a plurality of the first bumps 400 so as to be electrically connected to the second semiconductor device 200.

The first semiconductor device 100 may include a first through electrode that penetrates the first semiconductor device 100. The first through electrode may include the first plug 30 and second plug 60. The second semiconductor device 200 may include a second through electrode that penetrates the second semiconductor device 200. The second through electrode may include a third plug 230 and fourth plug 260.

The first and second through electrodes may be substantially the same as the through electrode that is illustrated and described with reference to FIG. 1. As illustrated in FIG. 3, the first through electrode of the first semiconductor device 100 may include the first and second plugs 30 and 60. The second plug 60 of the first semiconductor device 100 may be connected to a connection pad 244 of the second semiconductor device 200 by the first bump 400. For example, the first bump 400 may include a solder such as tin (Sn), tin/silver (Sn/Ag), tin/copper (Sn/Cu), tin/indium (Sn/In), etc.

A sealing member 350 may be formed on the mounting substrate 300 to protect the first and second semiconductor devices 100 and 200 from an outside environment. Solder balls 340 may be disposed on the outer connection pads 330 of the mounting substrate 300. The semiconductor package may be mounted on a module substrate (not illustrate) using the solder balls 340 to form a memory module.

Hereinafter, a method of manufacturing a semiconductor device in accordance with a non-limiting example embodiment will be explained.

FIGS. 4 to 12 are cross-sectional views illustrating a method of manufacturing the semiconductor device in FIG. 1.

Figure 4:
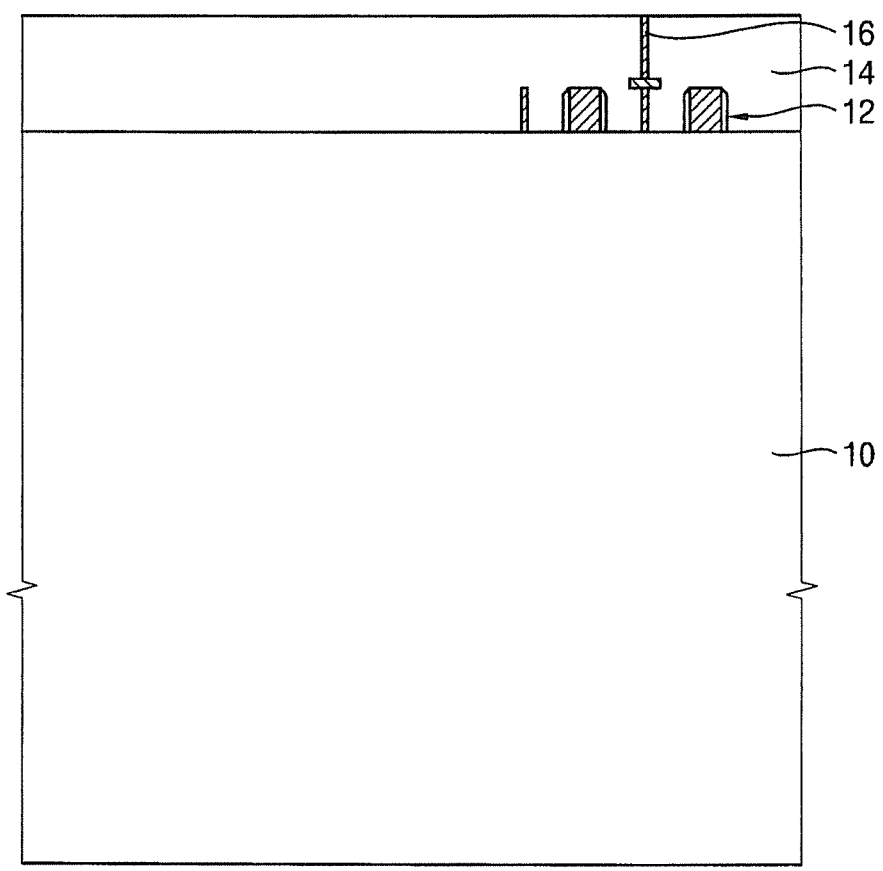

Referring to FIG. 4, a substrate 10 having a circuit pattern 12 formed thereon is prepared. The substrate 10 may have a first surface and a second surface opposite to the first surface. For example, the substrate 10 may be a single-crystalline silicon substrate.

The circuit patterns 12 are formed on the first surface of the substrate 10. The circuit pattern 12 may include a transistor, a diode, a capacitor, etc. An insulation interlayer 14 is formed on the first surface of the substrate 10 to cover the circuit patterns 12. An etch stop layer (not illustrated) may be formed on the insulation interlayer 14.

A wafer process (FEOL (front-end-of-line) process) may be performed to form the circuit patterns 12 on the substrate 10. After the circuit patterns 12 are formed on the substrate 10, a first plug 30 may be formed to extend from the first surface of the substrate 10 into the substrate 10 before performing a wiring process (BEOL (back-end-of-line) process).

Figure 5:
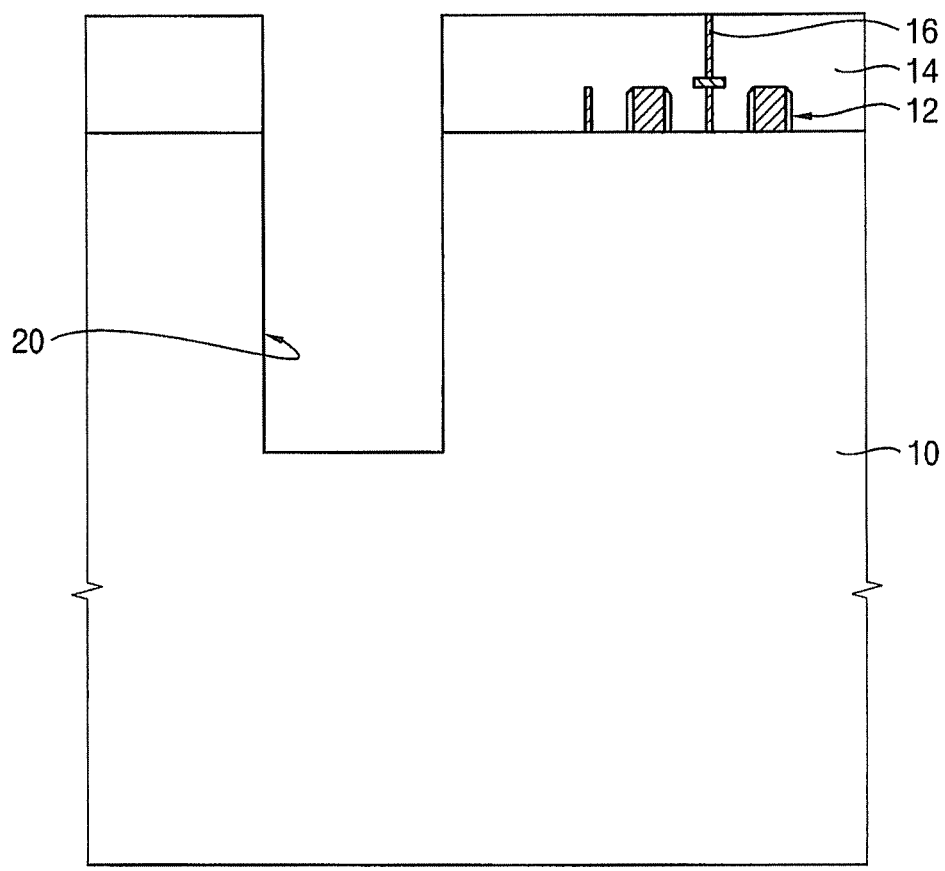

Referring to FIG. 5, a first opening 20 is formed in the substrate 10 to extend from the first surface in a thickness direction of the substrate 10.

After a photoresist layer (not illustrated) is formed on the insulation interlayer 14 on the substrate 10, the photoresist layer may be patterned to form a photoresist pattern.

The etch stop layer, the insulation interlayer 14 and the substrate 10 may be partially etched using the photoresist pattern as an etching mask to form the opening 20. For example, the opening 20 may be formed by a dry etch process. Then, the photoresist pattern is removed from the substrate 10.

Figure 6:
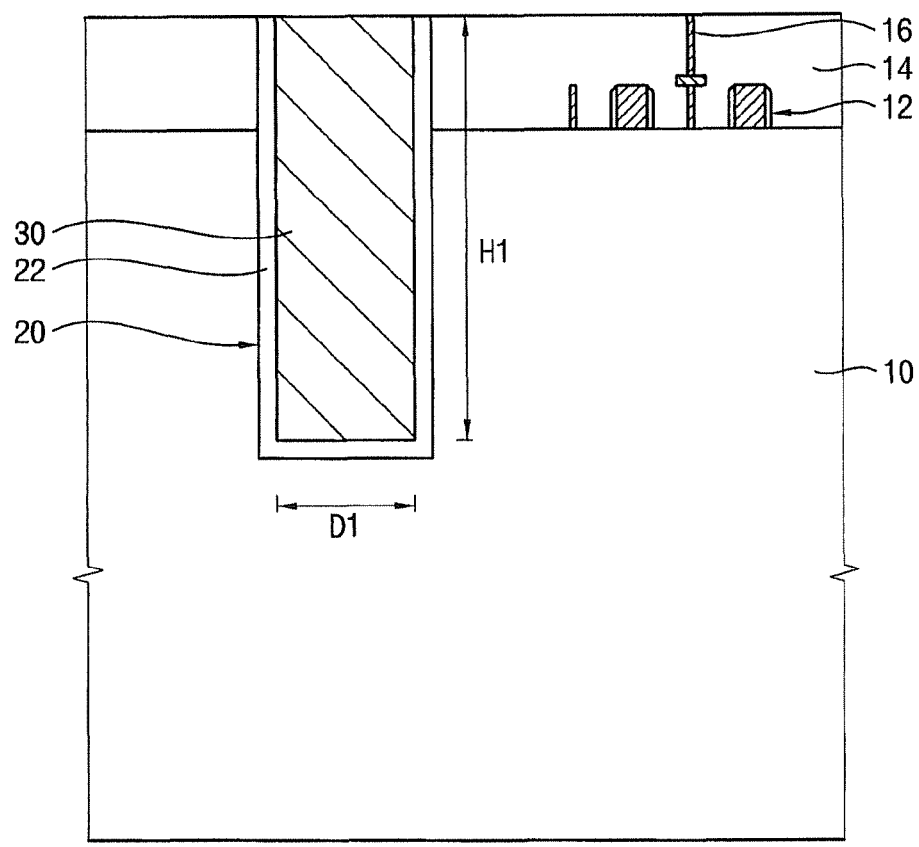

Referring to FIG. 6, a first plug 30 is formed to fill the first opening 20.

A first insulation layer may be formed conformally on sidewalls and a bottom surface of the first opening 20 and an upper surface of the insulation interlayer 14. The first insulation layer may insulate the substrate 10 from a conductive material within the first opening 20. The first insulation layer may include silicon oxide or carbon doped silicon oxide. For example, the first insulation layer may be formed by a plasma oxidation process or a chemical vapor deposition process. The first insulation layer may be formed using a TEOS layer or an ozone TEOS layer.

In a non-limiting example embodiment, a barrier layer (not illustrated) may be formed on the first insulation layer. The barrier layer may include a metal such as tantalum (Ta), titanium (Ti), ruthenium (Ru), cobalt (Co), Nickel (Ni) and tungsten (W), or a metal nitride. These elements may be used alone or in a mixture thereof.

A seed layer (not illustrated) may be formed on the barrier layer. The seed layer may be used as an electrode in a plating process for forming a subsequent conductive layer.

A conductive layer may be formed on the seed layer to fill the first opening 20. The conductive layer may be formed using a metal material having a relatively low resistance. For example, the conductive layer may be formed by an electro plating process, an electroless plating process, an electrografting process, etc. The conductive layer may include copper (Cu), aluminum (Al), gold (Au), indium (In), nickel (Ni), etc. These elements may be used alone or in a mixture thereof.

The conductive layer, the barrier layer and the first insulation layer may be planarized by a chemical mechanical polishing process to form the first plug 30 and a first insulation layer pattern 22. The first plug 30 may include a first conductive pattern and a first barrier layer pattern.

Figure 7:
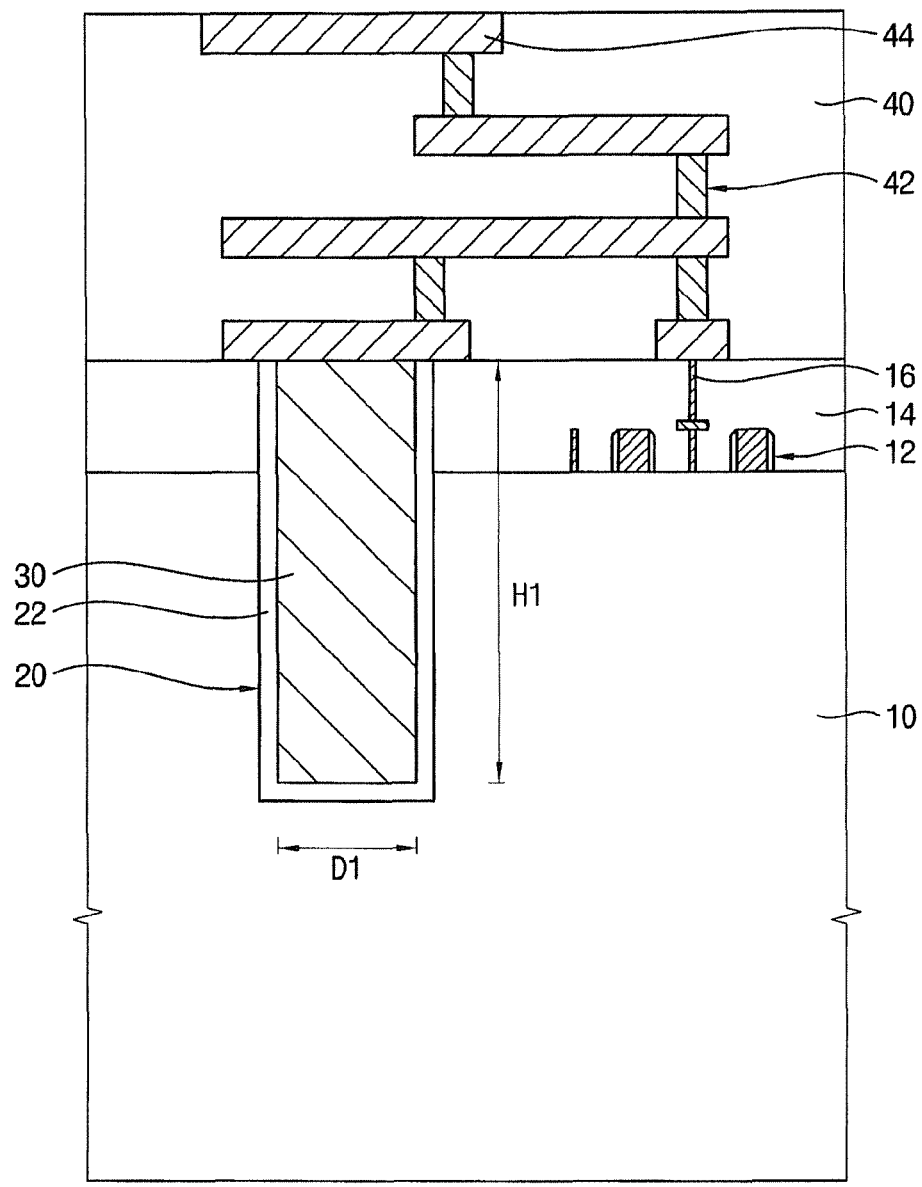

Referring to FIG. 7, an upper wiring layer 40 is formed on the first surface of the substrate 10. The upper wiring layer 40 includes wirings 42 that electrically connect the first plug 30 and the circuit pattern 12 on the substrate 10.

For example, an inter-metal dielectric (IMD) layer may be formed as an upper wiring layer 40 on the insulation interlayer 14. The wirings 42 may be formed in the inter-metal dielectric layer to electrically connect the lower wiring 16 and the first plug 30.

Figure 8:
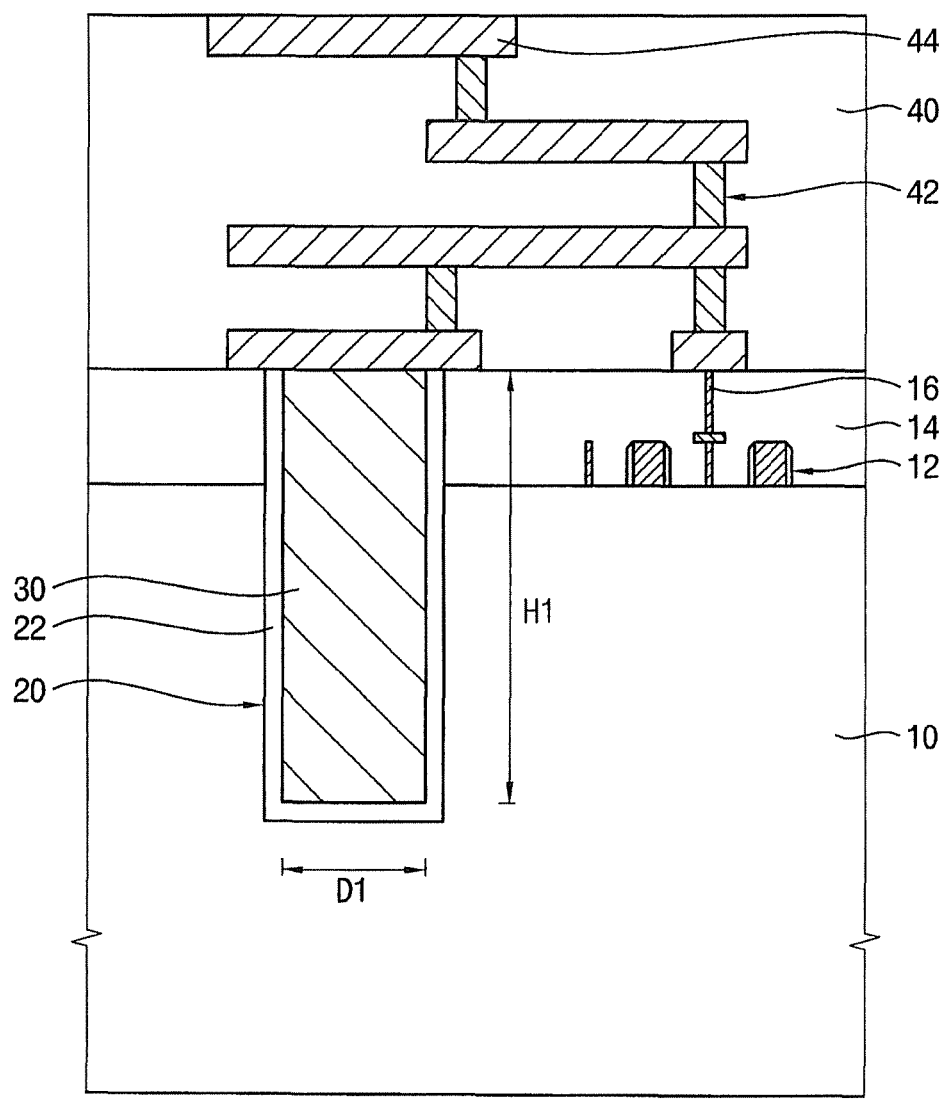

Referring to FIG. 8, the second surface of the substrate 10 is planarized to control a thickness of the substrate 10. For example, the second surface of the substrate 10 may be removed by a grinding process.

The thickness of the substrate 10 may be selected based on a thickness of a subsequent through electrode (e.g., second plug 60), a thickness of a stack package, etc.

Figure 9:
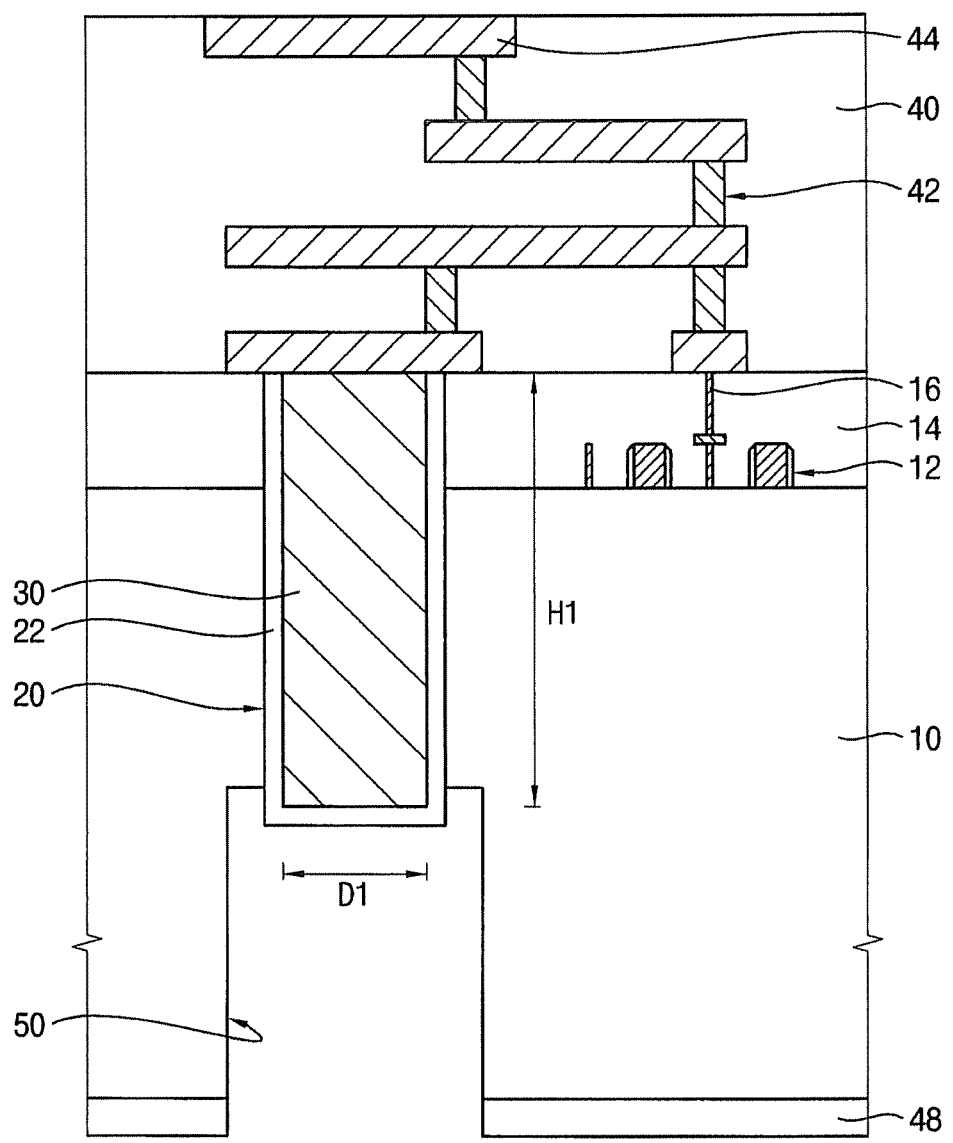

Referring to FIG. 9, a second opening 50 is formed in the substrate 10 to extend from the second surface in the thickness direction of the substrate 10 and expose a lower portion of the first plug 30.

After a photoresist layer (not illustrated) is formed on the second surface of the substrate 10, the photoresist layer is patterned to form a photoresist pattern 48. The substrate 10 is partially etched using the photoresist pattern 48 as an etching mask to form the second opening 50 that is connected to the first opening 20.

For example, the second opening 50 may be formed by a dry etch process or a wet etch process. Then, the photoresist pattern 48 is removed from the substrate 10.

In a non-limiting example embodiment, the diameter of the second opening 50 may be greater than that of the first opening 20. The depth of the second opening 50 may be substantially the same as that of the first opening 20. Alternatively, the depth of the second opening 50 may be greater or smaller than that of the first opening 20.

The heights of the first and second openings 20 and 50 may be selected based on the thickness of the substrate 10, a desired aspect ratio, a thermal expansion coefficient of the conductive material in the opening, a process temperature, and so on.

Figure 10:
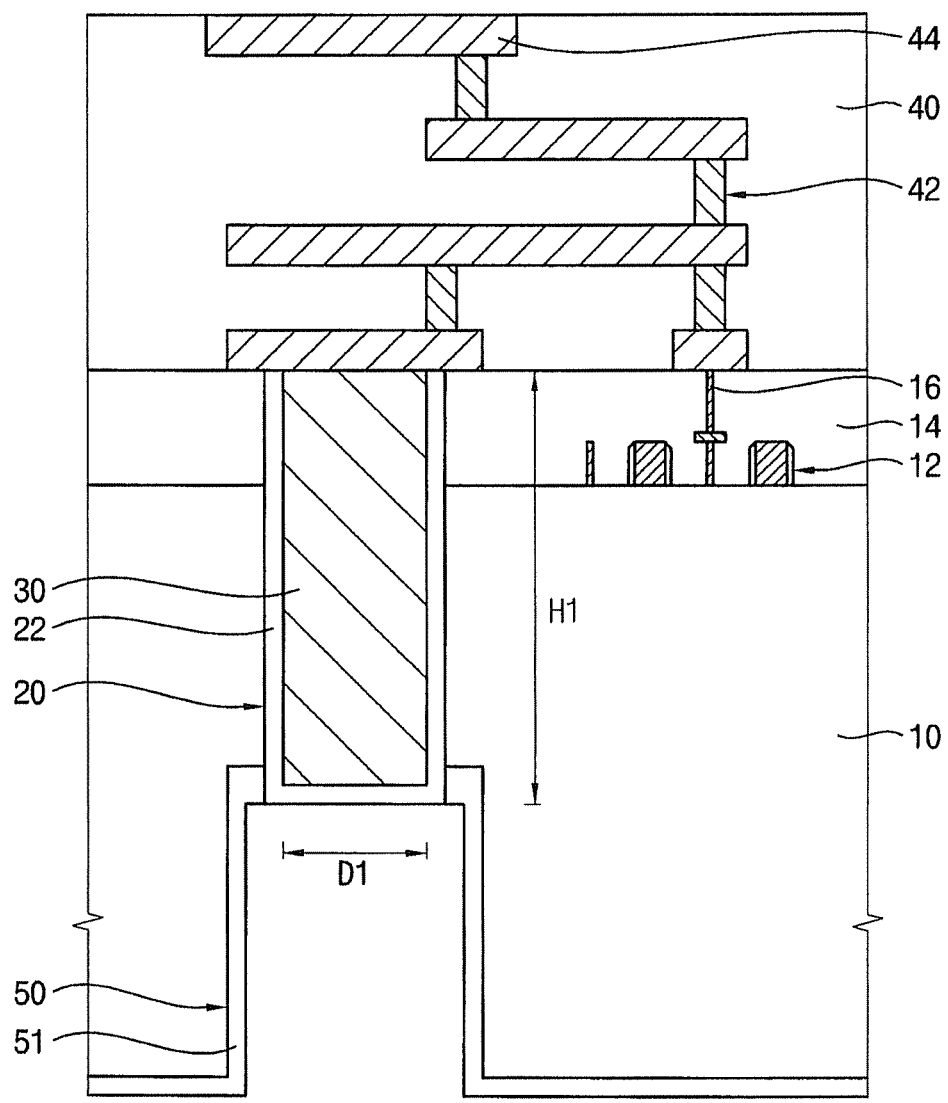

Referring to FIG. 10, a second insulation layer 51 is formed conformally on sidewalls and a bottom surface of the second opening 50 and the second surface of the substrate 10. The second insulation layer 51 may insulate the substrate 10 from a subsequent conductive material within the second opening 50. The second insulation layer 51 may include silicon oxide or polymer. For example, the second insulation layer 51 may be formed by a chemical vapor deposition process or a spin coat process. The second insulation layer 51 may be formed using an insulation material having the desired step coverage.

Figure 11:
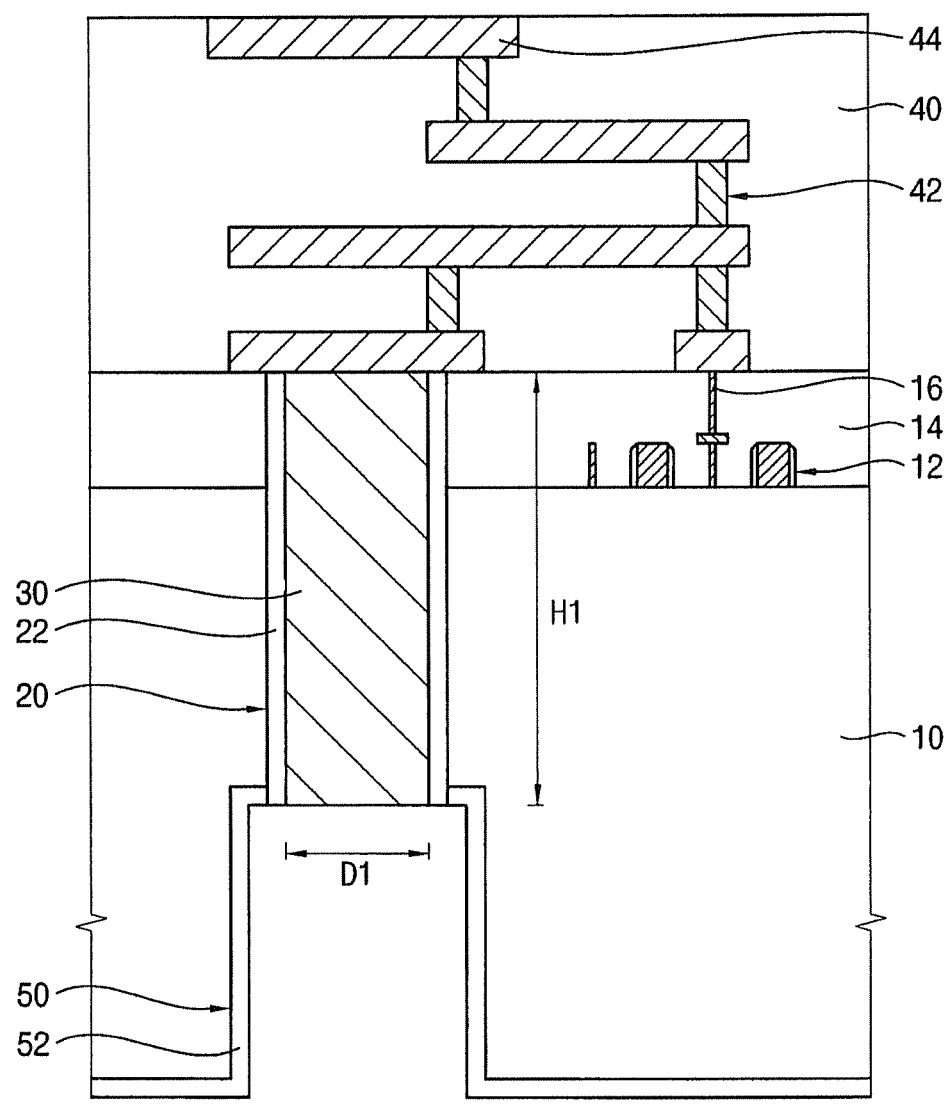

Referring to FIG. 11, the second insulation layer 51 is partially removed to form a second insulation layer pattern 52 that exposes a lower portion of the first plug 30. For example, the second insulation layer 51 may be partially removed by an etch back process. The first insulation layer pattern 22 may be partially removed together with the second insulation layer 51 to expose the lower portion of the first plug 30. Accordingly, the second insulation layer 51 in the second opening 50 may be partially removed to expose a lower surface of the first plug 30.

Figure 12:
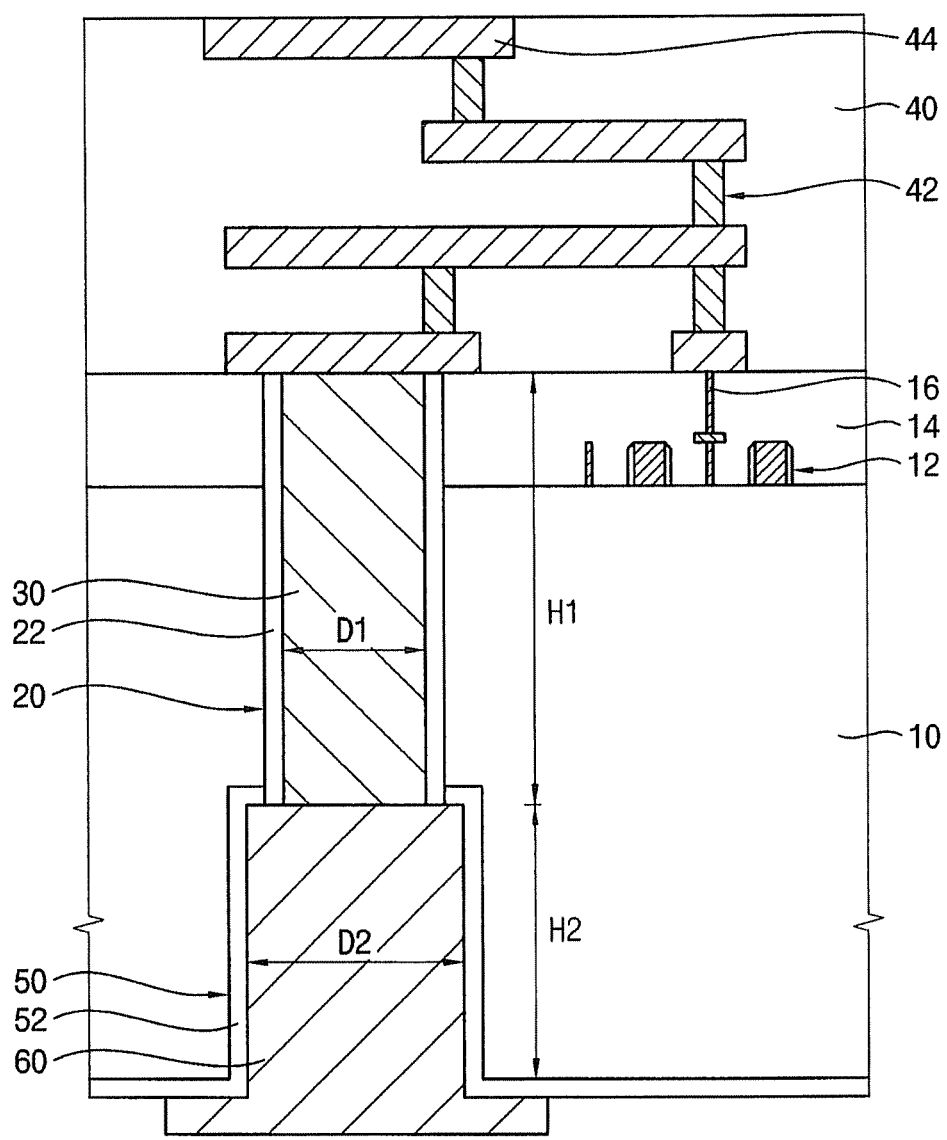

Referring to FIG. 12, a second plug 60 is formed to fill the second opening 50.

In a non-limiting example embodiment, a barrier layer (not illustrated) may be formed on the second insulation layer pattern 52 in the second opening 50. The barrier layer may include a metal such as tantalum (Ta), titanium (Ti), ruthenium (Ru), cobalt (Co), nickel (Ni) and tungsten (W), or a metal nitride. These materials may be used alone or in a mixture thereof.

A seed layer (not illustrated) may be formed on the barrier layer. The seed layer may be used as an electrode in a plating process for forming a subsequent conductive layer.

A conductive layer may be formed on the seed layer to fill the second opening 50. The conductive layer may be formed using a metal material having a relatively low resistance. For example, the conductive layer may be formed by an electro plating process, an electroless plating process, an electrografting process, etc. The conductive layer may include copper (Cu), aluminum (Al), gold (Au), indium (In), nickel (Ni), etc. These elements may be used alone or in a mixture thereof.

The conductive layer and the barrier layer are patterned to form the second plug 60 in the second opening 50. The second plug 60 is connected to the first plug 30. The second plug 60 may include a second conductive pattern and a second barrier layer pattern.

For example, the first plug 30 may have a first height (H1) and a first diameter (D1). The second plug 60 may have a second height (H2) and a second diameter (D2). The second diameter (D2) of the second plug 60 may be greater than the first diameter (D1) of the first plug 30.

Accordingly, a through electrode penetrating the substrate 10 and including the first plug 30 and the second plug 60 may be provided to form the semiconductor device 100 in FIG. 1.

Referring back to FIGS. 2 and 3, the first semiconductor device 100 in FIG. 1 is stacked on the second semiconductor device 200 using the first bump 400. The first bump 400 is formed on the second plug 60 of the first semiconductor device 100 and is adhered to the connection pad 244 of the second semiconductor device 200.

For instance, the first bump 400 may be adhered to the connection pad 244 of the second semiconductor device 200 by a reflow process such that the first semiconductor device 100 is stacked on the second semiconductor device 200. Similarly, the second bump 410 may be adhered to the connection pad 320 of the mounting substrate 300 such that the second semiconductor device 200 is mounted on the mounting substrate 300.

A sealing member 350 is formed on the upper surface of the mounting substrate 300 to protect the first and second semiconductor devices 100 and 200 from an outside environment. After a plurality of solder balls 340 is disposed on the outer connection pads 330 on the lower surface of the mounting substrate 300, the semiconductor package of FIG. 2 may be mounted on a module substrate (not illustrate) using the solder balls 340 to complete a memory module (not illustrated).

After a wafer process (FEOL process) is performed on the substrate 10, the first plug 30 may be formed to extend from the first surface into the substrate 10, and then, a wiring process (BEOL process) may be performed to form the upper wiring layer 40 on the first surface of the substrate 10. The second plug 60 is formed to extend from the second surface so as to be connected to the first plug 30. Accordingly, a through electrode of a semiconductor chip may be formed with relative ease to have a desired length.

Because the first plug 30 may be smaller than a subsequent through electrode, a thermal stress to the first plug 30 under a relatively high temperature (for example, 400° C.) of the BEOL process may be reduced. In addition, the second opening 50 for forming the second plug 60 may be formed to have a relatively high aspect ratio without restriction on the process temperature. Accordingly, a subsequent through electrode may be formed to have a desired depth without thermal stress.

Additionally, in a method of manufacturing a through electrode in accordance with a non-limiting example embodiment, processes such as a chemical mechanical polishing process and an etching process may not be required to be performed on a substrate in order to expose a lower portion of a plug formed in the substrate. Accordingly, costs for forming the through electrode may be reduced. Furthermore, during the manufacturing processes, a conductive material such as copper may be prevented from diffusing into the substrate.

Figure 13:
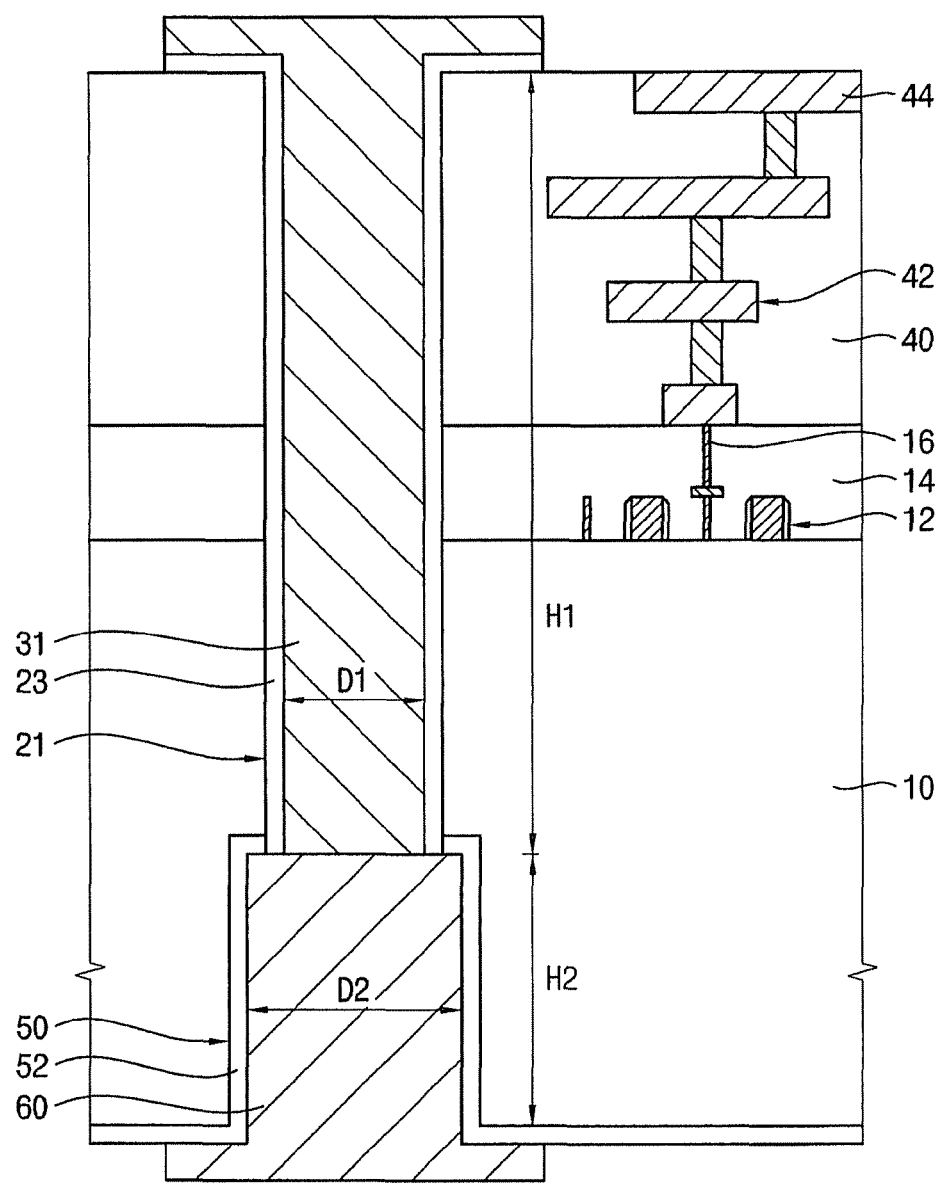

FIG. 13 is a cross-sectional view illustrating a semiconductor device in accordance with another non-limiting example embodiment. The semiconductor device in FIG. 13 is substantially the same as the semiconductor device in FIG. 1 except for the through electrode. Thus, the same reference numerals will be used to refer to the same or like elements as those described in connection with FIG. 1 and any further repetitive explanation concerning the above elements will be omitted for purposes of brevity.

Referring to FIG. 13, a first semiconductor device 101 according to another non-limiting example embodiment includes a substrate 10 and a through electrode penetrating the substrate 10. The through electrode has first and second plugs 31 and 60 connected to each other. The first semiconductor device 101 may be a semiconductor chip.

Circuit patterns 12 may be provided on a first surface of the substrate 10. An insulation interlayer 14 may be provided on the substrate 10 to cover the circuit patterns 12. The circuit patterns 12 may be electrically connected to lower wirings 16.

An upper wiring layer 40 may be provided on the insulation interlayer 14 of the substrate 10. Wirings 42 may be formed in the upper wiring layer 40 so as to be electrically connected to the circuit patterns 12.

A first opening 21 and a second opening 50 connected to the first opening 21 may be provided in the upper wiring layer 40, the insulation interlayer 14, and the substrate 10. The first opening 21 may be provided so as to penetrate the upper wiring layer 40 and the insulation interlayer 14. The first opening 21 may extend from the first surface of the substrate 10 in a thickness direction of the substrate 10. The second opening 50 may extend from the second surface of the substrate 10 in the thickness direction of the substrate 10 so as to be connected to the first opening 21.

A first insulation layer pattern 23 may be provided on the inner walls of the first opening 21 and a second insulation layer pattern 52 may be provided on the inner walls of the second opening 50. The first plug 31 may be provided on the first insulation layer pattern 23 to fill the first opening 21. The second plug 60 may be provided on the second insulation layer pattern 52 to fill the second opening 50.

Accordingly, the first plug 31 may penetrate the upper wiring layer 40 and the insulation interlayer 14 to extend from the first surface in the thickness direction of the substrate 10. The second plug 60 may extend from the second surface in the thickness direction of the substrate 10 so as to be connected to the first plug 31.

The first plug 31 may have a first height (H1) and a first diameter (D1). The second plug 60 may have a second height (H2) and a second diameter (D2). The second diameter (D2) of the second plug 60 may be greater than the first diameter (D1) of the first plug 31. The heights of the first and second plugs may be selected based on the thickness of the substrate 10, a desired aspect ratio, a thermal expansion coefficient of the conductive material in the opening, a process temperature, and so on.

The upper wiring layer 40 may be provided on the insulation interlayer 14. The upper wiring layer 40 may include the wirings 42 that are electrically connected to the circuit patterns 12. At least one of the wirings 42 may be electrically connected to the first plug 31. For example, although not illustrated, the first plug 31 may be electrically connected to the uppermost wiring 44 of the wiring 42 by a redistribution pad.

Figure 14:
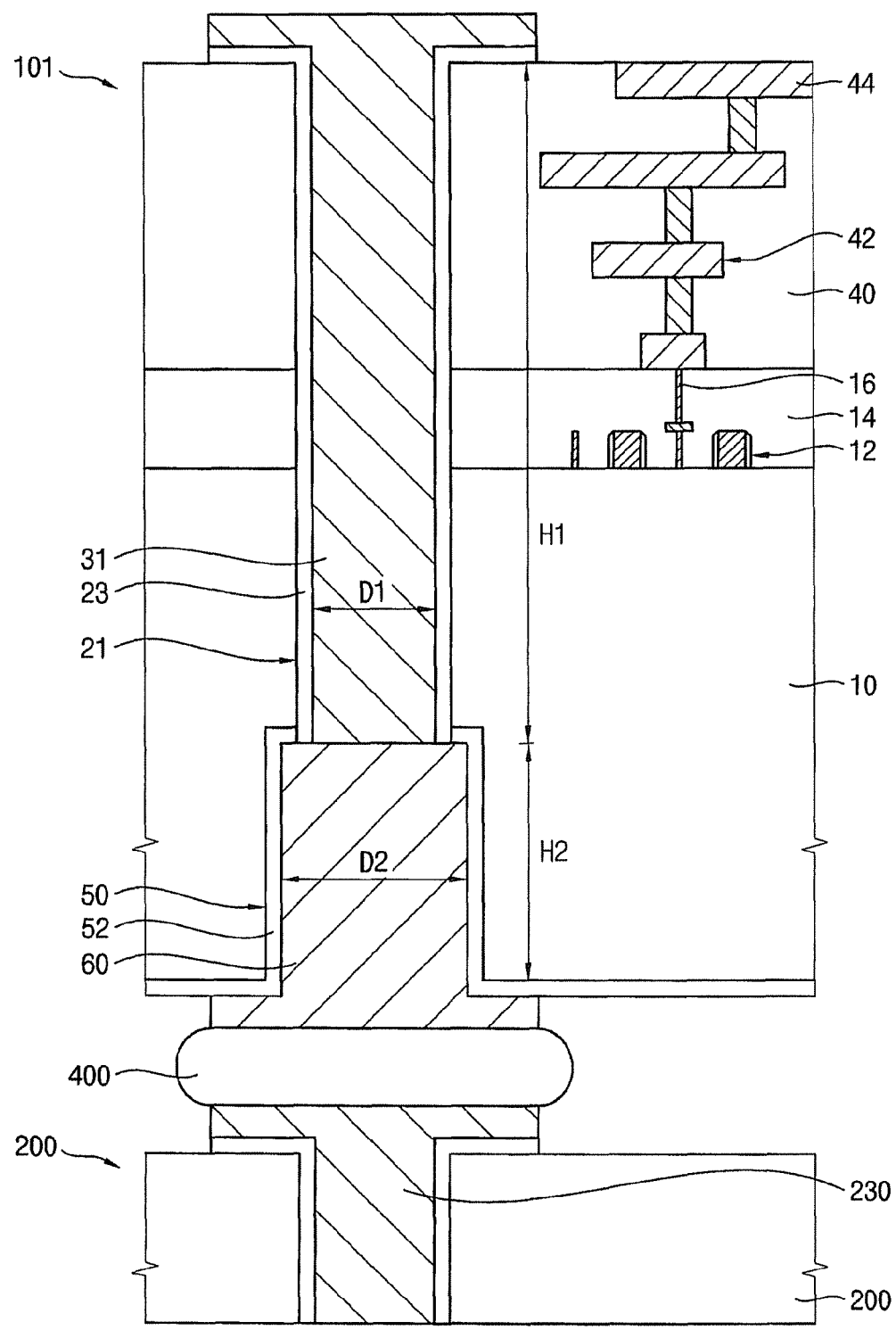

FIG. 14 is a cross-sectional view illustrating a portion of a semiconductor package including the semiconductor device in the FIG. 13.

Referring to FIG. 14, a first through electrode of the first semiconductor device 101 in FIG. 13 may be electrically connected to a third plug 230 of a second semiconductor device 200 by a first bump 400. For example, the second plug 60 of the first semiconductor device 101 in FIG. 13 may be electrically connected to the third plug 230 of the second semiconductor device 200 by the first bump 400.

Hereinafter, a method of manufacturing a semiconductor device in accordance with another non-limiting example embodiment will be explained.

FIGS. 15 to 22 are cross-sectional views illustrating a method of manufacturing the semiconductor device in FIG. 13.

First, the processes that are illustrated with reference to FIG. 4 may be performed to form circuit patterns 12 on a substrate 10 and an insulation interlayer 14 on the substrate 10 to cover the circuit patterns 12. Accordingly, a wafer process (FEOL process) may be performed to form the circuit patterns 12 on a first surface of the substrate 10.

Figure 15:
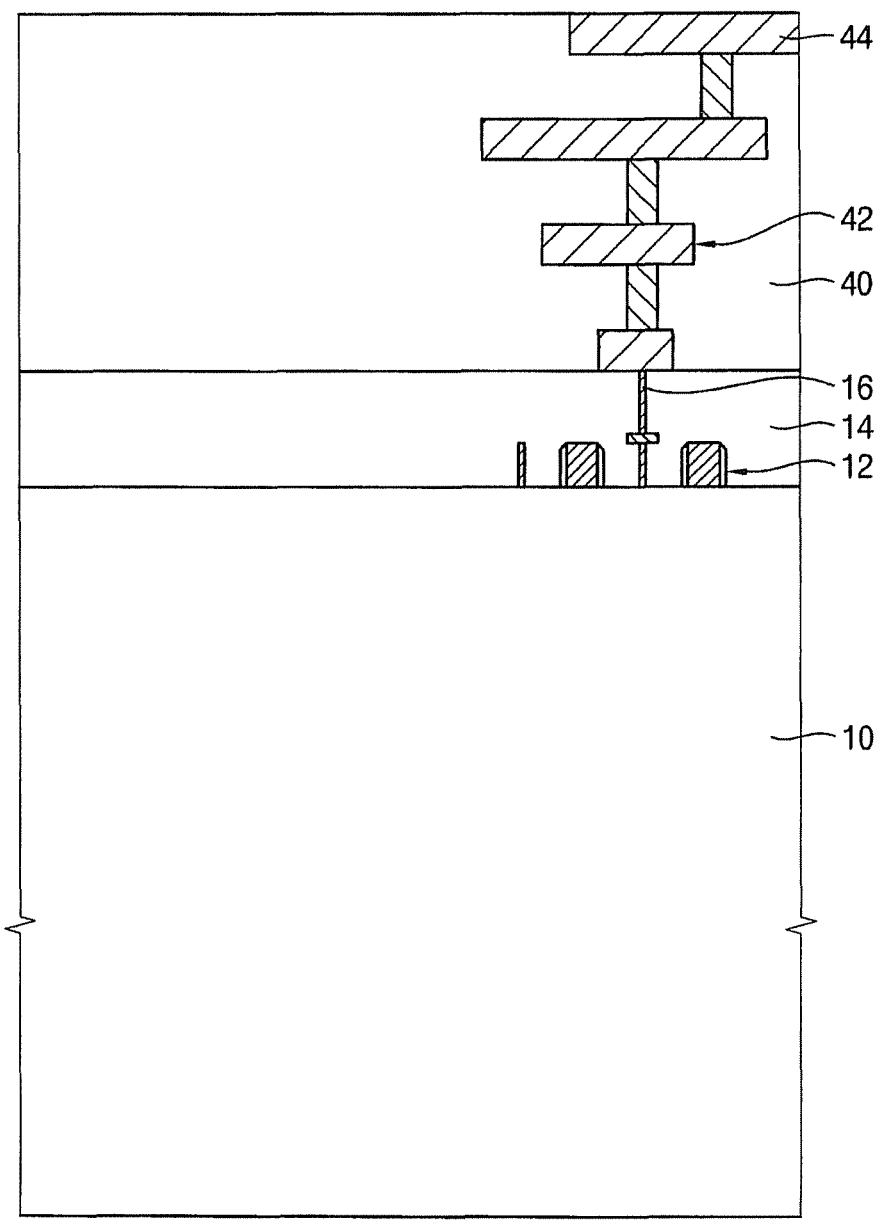

Referring to FIG. 15, an upper wiring layer 40 is formed on the first surface of the substrate 10. The upper wiring layer 40 includes wirings 42 that are electrically connected to the circuit pattern 12.

For example, an inter-metal dielectric (IMD) layer may be formed as the upper wiring layer 40 on the insulation interlayer 40. The wirings 42 may be formed in the inter-metal dielectric layer so as to be electrically connected to the lower wirings 16. Accordingly, a wiring process (BEOL process) may be performed to form the upper wiring layer 40 on the insulation interlayer 14.

After performing a wiring process (BEOL process), first and second plugs 31 and 60 may be formed to penetrate the substrate 10.

Figure 16:
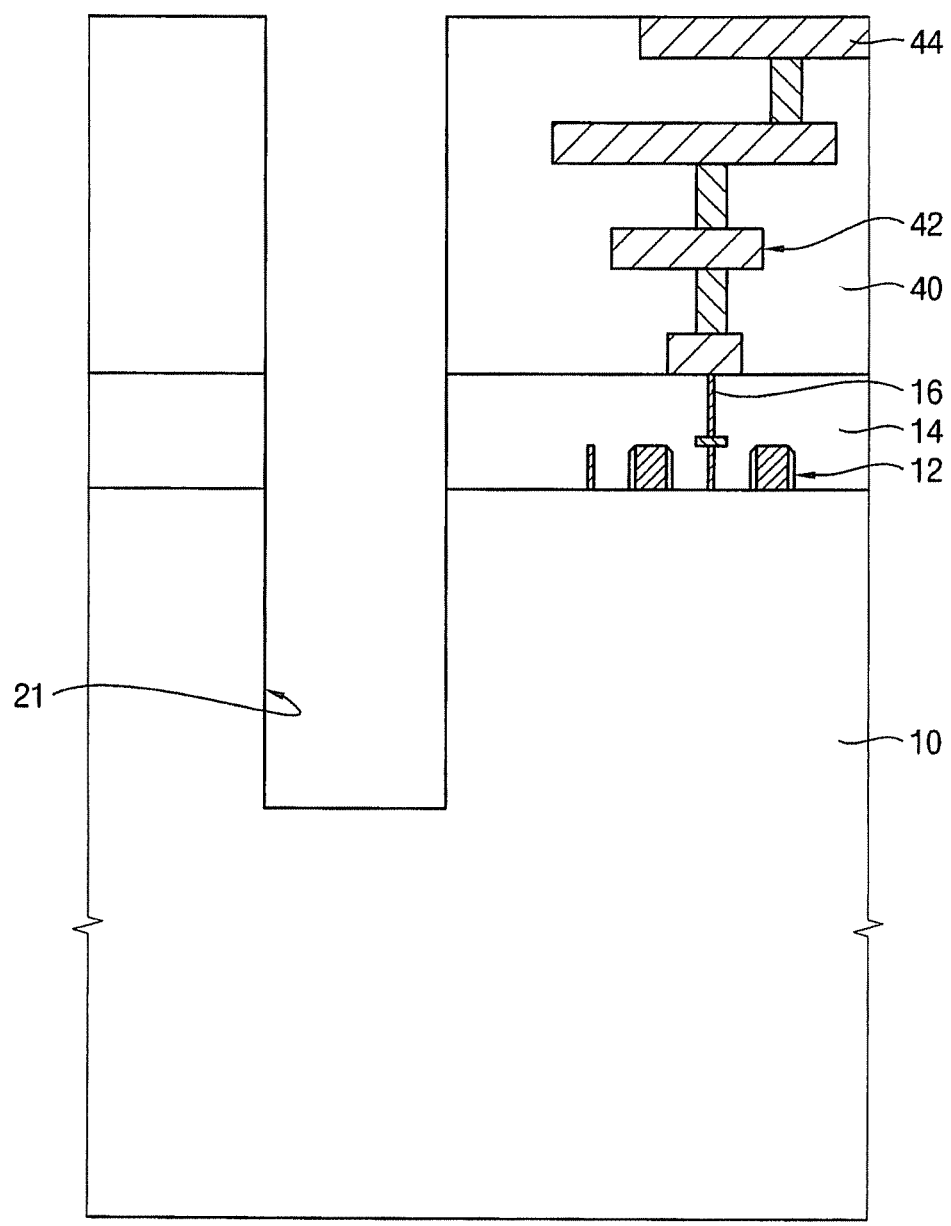

Referring to FIG. 16, a first opening 21 is formed in the substrate 10 to extend from the first surface in a thickness direction of the substrate 10.

After a photoresist layer (not illustrated) is formed on the upper wiring layer 40 on the substrate 10, the photoresist layer may be patterned to form a photoresist pattern.

The upper wiring layer 40, the insulation interlayer 14, and the substrate 10 may be partially etched using the photoresist pattern as an etching mask to form the opening 21. For example, the opening 21 may be formed by a dry etch process. Then, the photoresist pattern is removed from the substrate 10.

Figure 17:
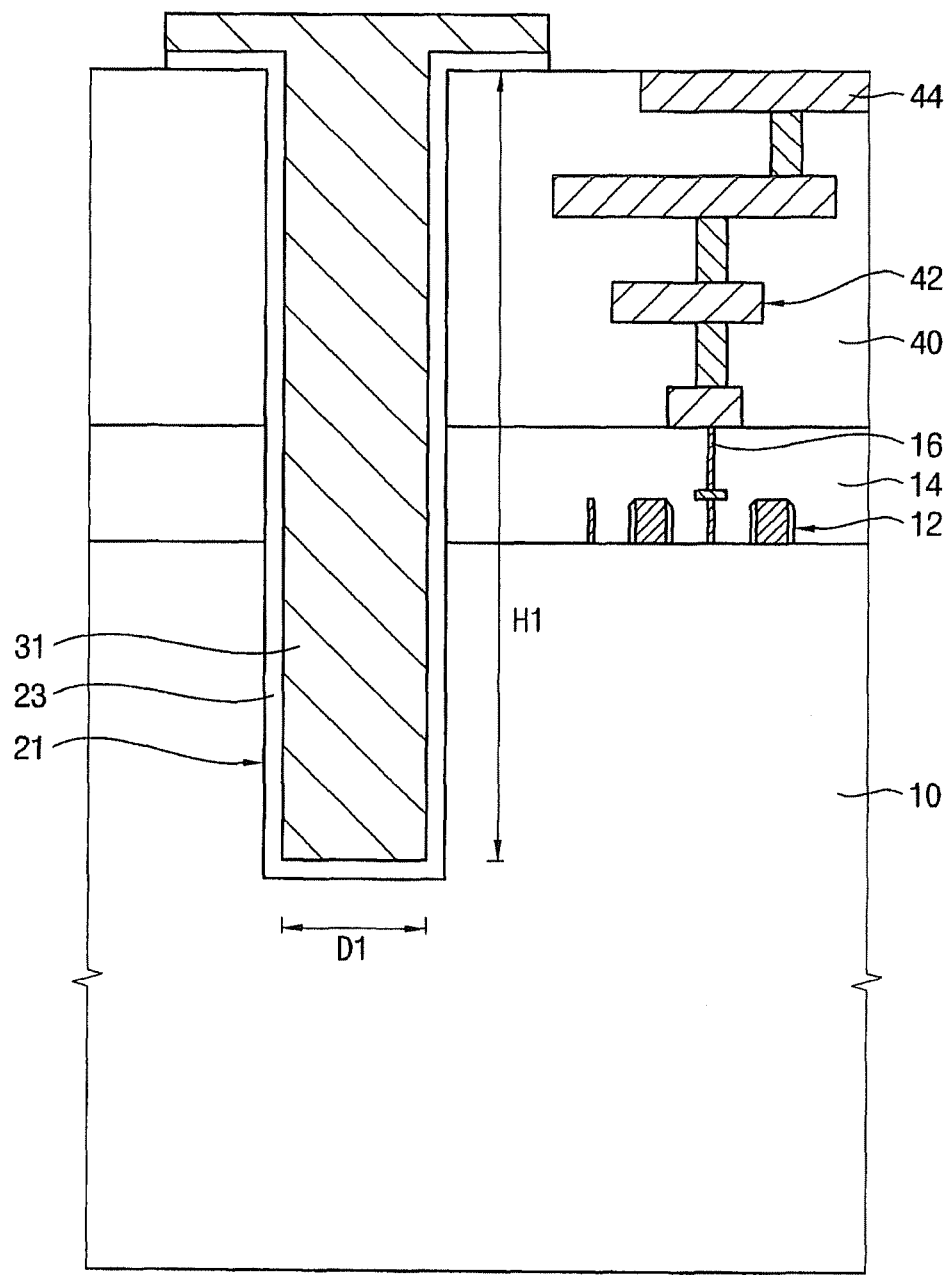

Referring to FIG. 17, a first plug 31 is formed so as to fill the first opening 21.

A first insulation layer (not illustrated) may be formed conformally on sidewalls and a bottom surface of the first opening 21 and an upper surface of the upper wiring layer 40. The first insulation layer may insulate the substrate 10 from a conductive material within the first opening 21.

For example, a barrier layer (not illustrated) and a seed layer (not illustrated) may be formed on the first insulation layer. The seed layer may be used as an electrode in a plating process for forming a subsequent conductive layer.

A conductive layer may be formed on the seed layer to fill the first opening 21. The conductive layer may be formed using a metal material having a relatively low resistance. For example, the conductive layer may be formed by an electro plating process, an electroless plating process, an electro-grafting process, etc.

The conductive layer, the barrier layer, and the first insulation layer may be patterned to form the first plug 31 and a first insulation layer pattern 23. The first plug 31 may include a first conductive pattern and a first barrier layer pattern.

The first plug 31 may be electrically connected to at least one of the wirings 42. For example, the first plug 31 may be electrically connected to the uppermost wiring 44 by a redistribution pad (not illustrated). Alternatively, the first plug 31 may be formed to penetrate the uppermost wiring 44.

Figure 18:
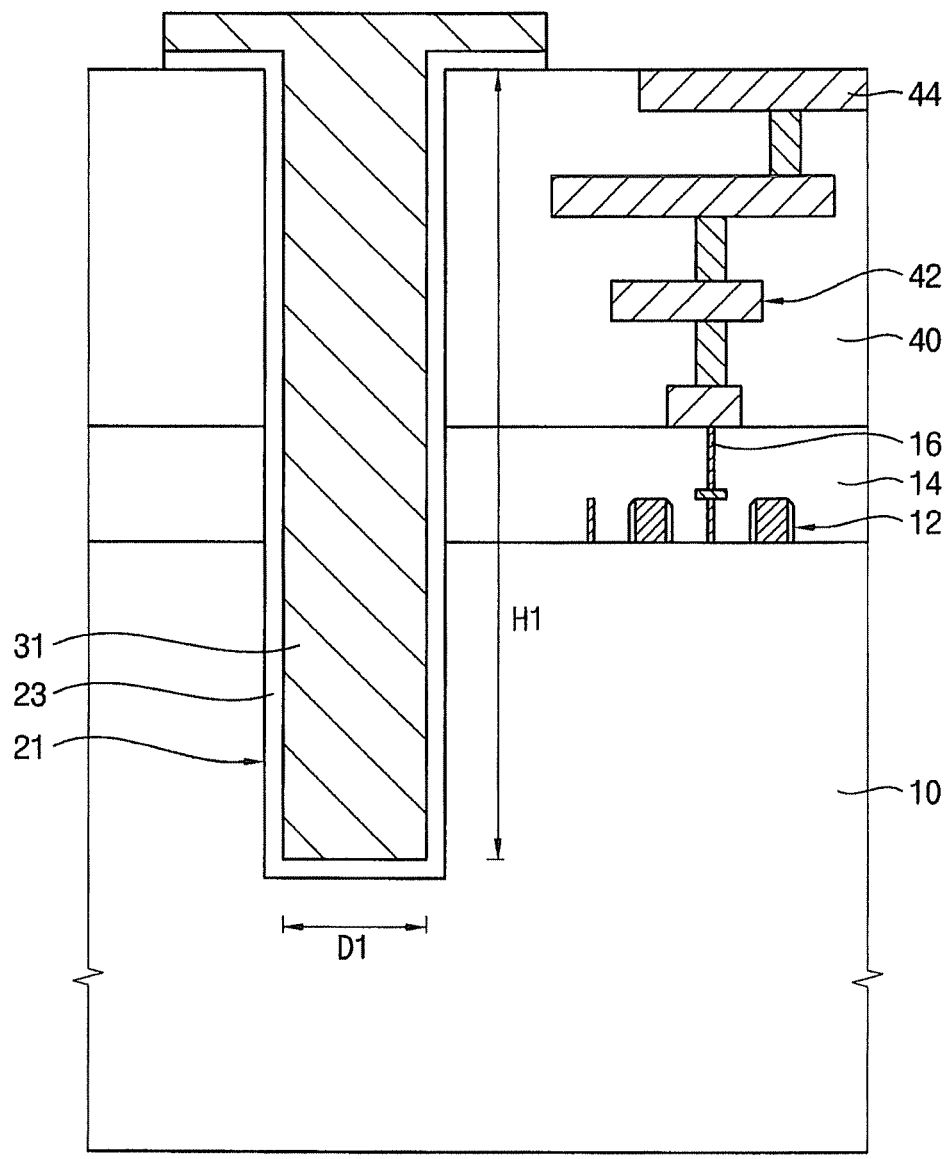

Referring to FIG. 18, the second surface of the substrate 10 is planarized to control a thickness of the substrate 10. For example, the second surface of the substrate 10 may be removed by a grinding process.

The thickness of the substrate 10 may be selected based on a thickness of a subsequent through electrode (e.g., second plug 60), a thickness of a stack package, etc.

Figure 19:
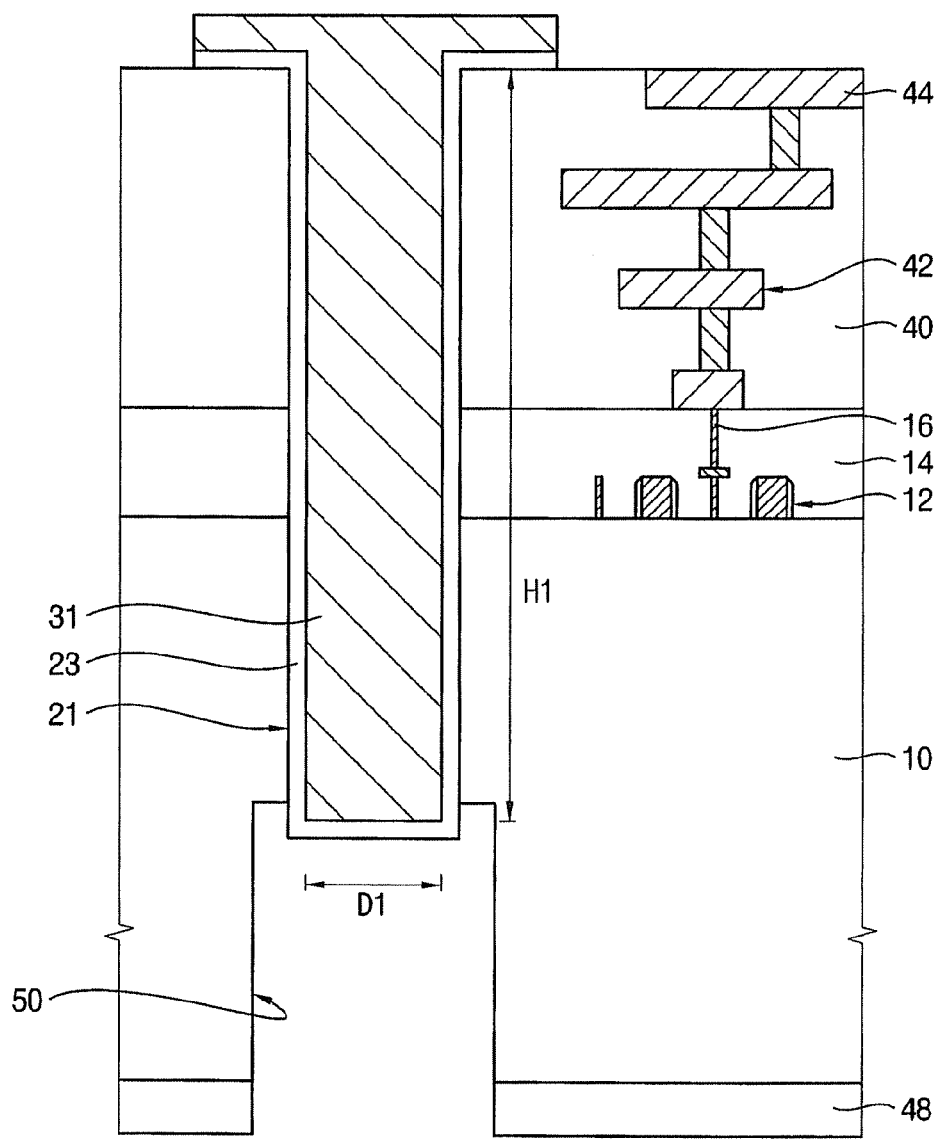

Referring to FIG. 19, a second opening 50 is formed in the substrate 10 to extend from the second surface in the thickness direction of the substrate 10 and expose a lower portion of the first plug 31.

After a photoresist layer (not illustrated) is formed on the second surface of the substrate 10, the photoresist layer may be patterned to form a photoresist pattern 48. The substrate 10 is partially etched using the photoresist pattern 48 as an etching mask to form the second opening 50 that is connected to the first opening 21.

For example, the second opening 50 may be formed by a dry etch process or a wet etch process. Then, the photoresist pattern 48 is removed from the substrate 10.

The diameter of the second opening 50 may be greater than that of the first opening 21. The depth of the second opening 50 may be substantially the same as that of the first opening 21. Alternatively, the depth of the second opening 50 may be greater or smaller than that of the first opening 21.

The heights of the first and second openings 21 and 50 may be selected based on the thickness of the substrate 10, a desired aspect ratio, a thermal expansion coefficient of the conductive material in the opening, a process temperature, and so on.

Figure 20:
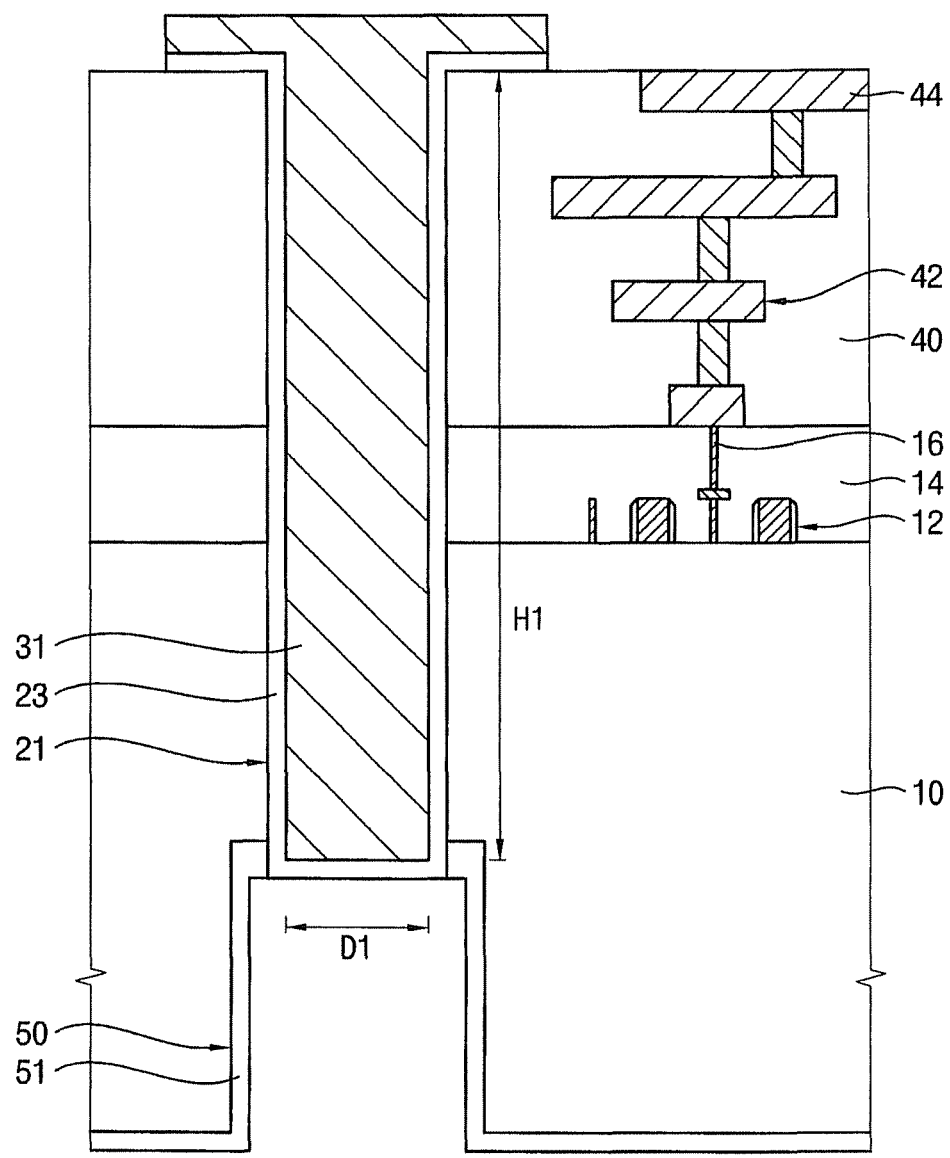

Referring to FIG. 20, a second insulation layer 51 is formed conformally on sidewalls and a bottom surface of the second opening 50 and the second surface of the substrate 10. The second insulation layer 51 may insulate the substrate 10 from a conductive material within the second opening 50.

Figure 21:
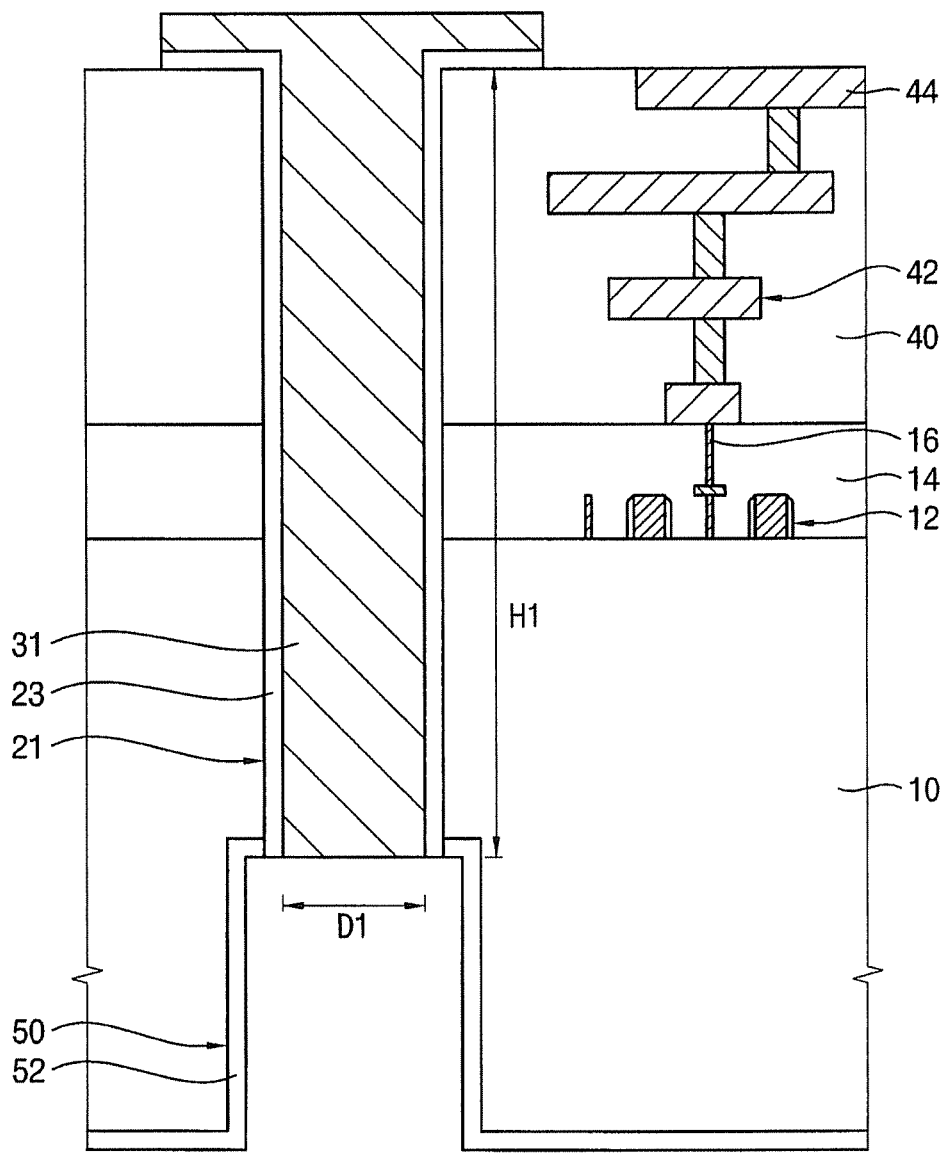

Referring to FIG. 21, the second insulation layer 51 is partially removed to form a second insulation layer pattern 52 that exposes a lower portion of the first plug 31. For example, the second insulation layer 51 may be partially removed by an etch back process. The first insulation layer pattern 23 may be partially removed together with the second insulation layer 51 to expose the lower portion of the first plug 31. Accordingly, the second insulation layer 51 in the second opening 50 may be partially removed to expose a lower surface of the first plug 31.

Figure 22:
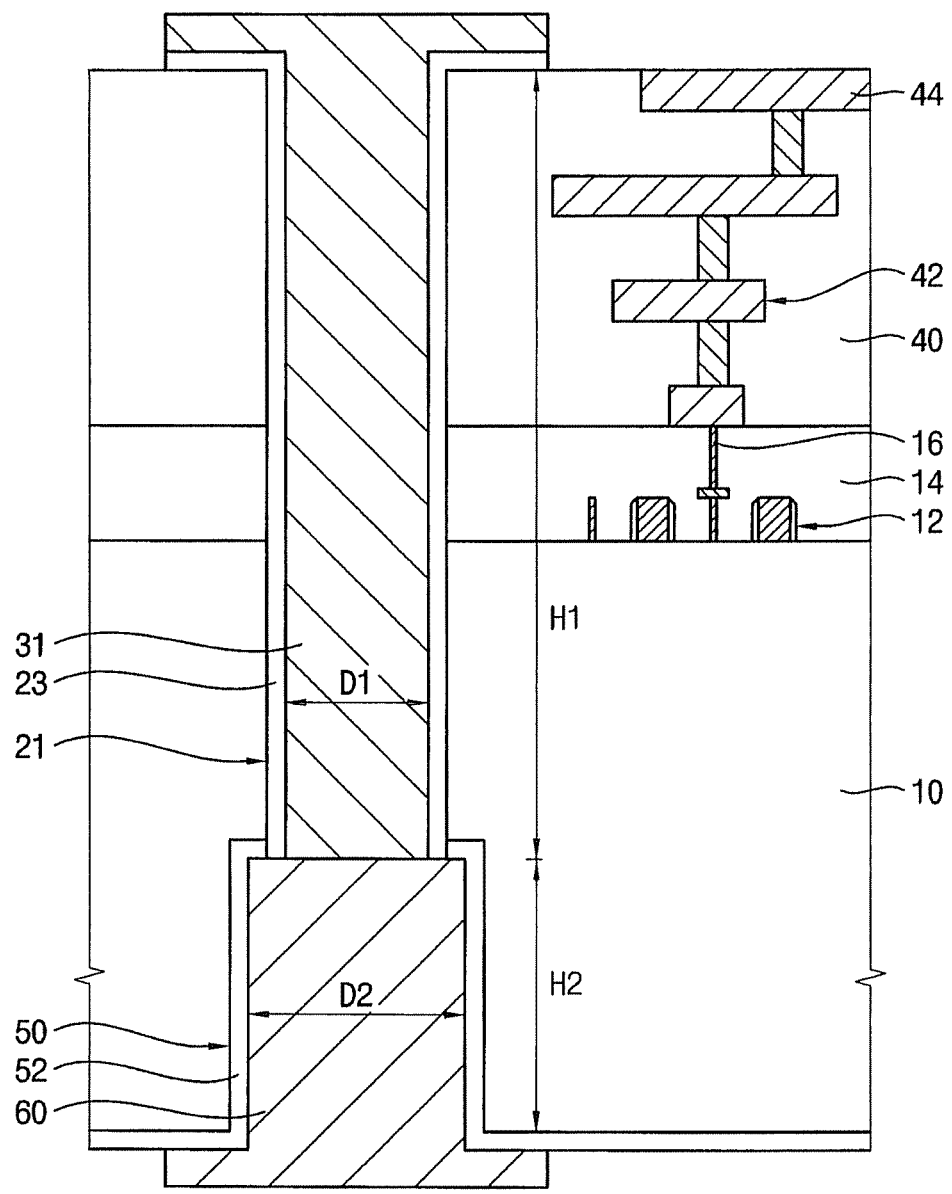

Referring to FIG. 22, a second plug 60 is formed to fill the second opening 50.

For example, a barrier layer (not illustrated) may be formed on the second insulation layer pattern 52 in the second opening 50. The barrier layer may include a metal such as tantalum (Ta), titanium (Ti), ruthenium (Ru), cobalt (Co), Nickel (Ni) and tungsten (W), or a metal nitride. These materials may be used alone or in a mixture thereof.

A seed layer (not illustrated) may be formed on the barrier layer. The seed layer may be used as an electrode in a plating process for forming a subsequent conductive layer.

A conductive layer may be formed on the seed layer to fill the second opening 50. The conductive layer may be formed using a metal material having a relatively low resistance. For example, the conductive layer may be formed by an electro plating process, an electroless plating process, an electrografting process, etc. The conductive layer may include copper (Cu), aluminum (Al), gold (Au), indium (In), nickel (Ni), etc. These elements may be used alone or in a mixture thereof.

The conductive layer and the barrier layer are patterned to form the second plug 60 in the second opening 50. The second plug 60 is connected to the first plug 31. The second plug 60 may include a second conductive pattern and a second barrier layer pattern.

For example, the first plug 31 may have a first height (H1) and a first diameter (D1). The second plug 60 may have a second height (H2) and a second diameter (D2). The second diameter (D2) of the second plug 60 may be greater than the first diameter (D1) of the first plug 31.

Accordingly, a through electrode penetrating the substrate 10 and including the first plug 31 and the second plug 60 may be provided to form the semiconductor chip 10 in the FIG. 13.

As illustrated in FIG. 14, the first semiconductor device 101 in FIG. 13 is stacked on the second semiconductor device 200 using the first bump 400. The first bump 400 may be adhered to the third plug 230 of the second semiconductor device 200 by a reflow process such that the first semiconductor device 101 is stacked on the second semiconductor device 200.

After a wiring process (BEOL process) is performed on the substrate 10 to form the upper wiring layer 40 in the first surface of the substrate 10, the first plug 31 is formed to extend from the first surface into the substrate 10, and then, the second plug 60 is formed to extend from the second surface so as to be connected to the first plug 31. Accordingly, a thermal stress under a relatively high temperature of the BEOL process may be avoided and the resultant through electrode may be formed to have a desired depth. Further, costs for forming the through electrode may be reduced, and the semiconductor chip may be prevented from being polluted by a through electrode such as copper to thereby improve the electrical reliability of the semiconductor chip.

FIGS. 23 to 29 are cross-sectional views illustrating various shapes for a plug of a through electrode.

Figure 23:
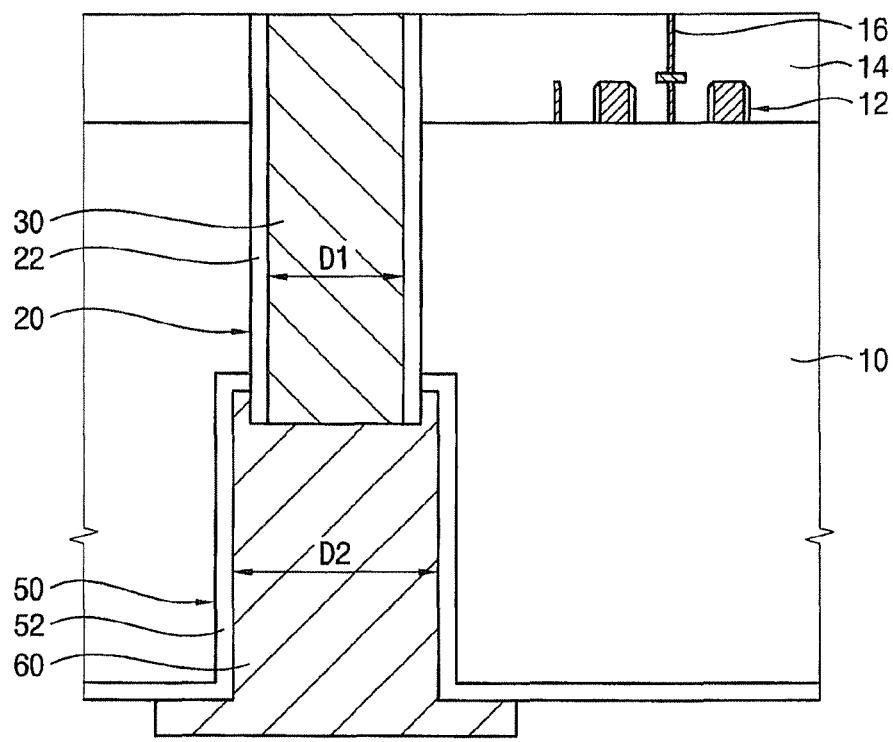

Referring to FIG. 23, the second plug 60 may have a second diameter (D2) that is greater than a first diameter (D1) of the first plug 30. The second opening 50 may be formed to partially expose a lower sidewall of the first plug 30. The second plug 60 may be a conductive pattern that completely fills the second opening 50. Accordingly, the second plug 60 may be formed to surround the lower sidewall of the first plug 30.

Figure 24:
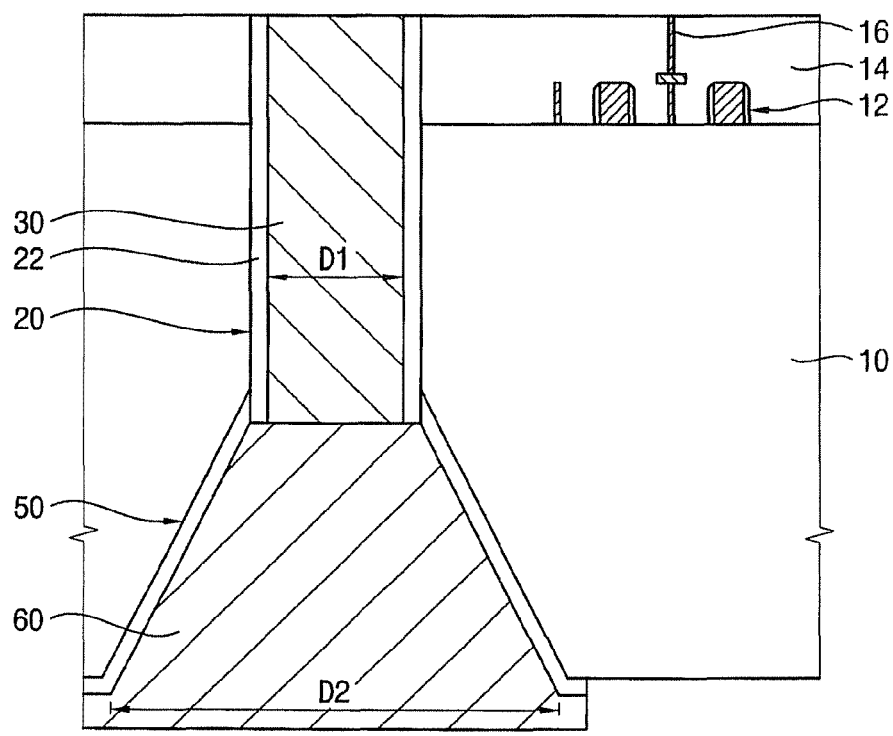

Referring to FIG. 24, the diameter of the second opening 50 may be gradually decreased (e.g., tapered) from the second surface in a thickness direction of the substrate 10. The second plug 60 may be a conductive pattern that completely fills the second opening 50. Accordingly, the second plug 60 may have a trapezoidal cross-sectional profile.

Figure 25:
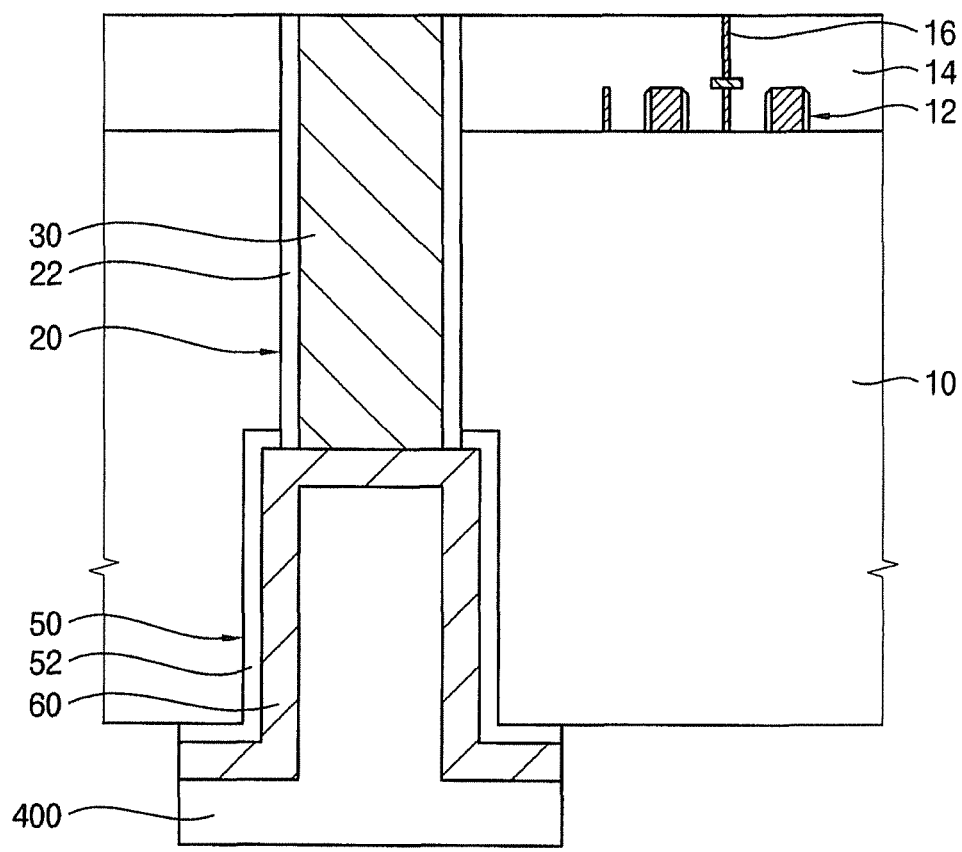

Referring to FIG. 25, the second plug 60 may be a conductive pattern that is formed conformally along the profile of the second opening 50 so as to only partially fill the second opening 50. As a result, the second plug 60 may have a recess that extends into an upper portion thereof. A first bump 400 may be disposed within the recess of the second plug 60 so as to be connected to another external connection pad or plug.

Figure 26:
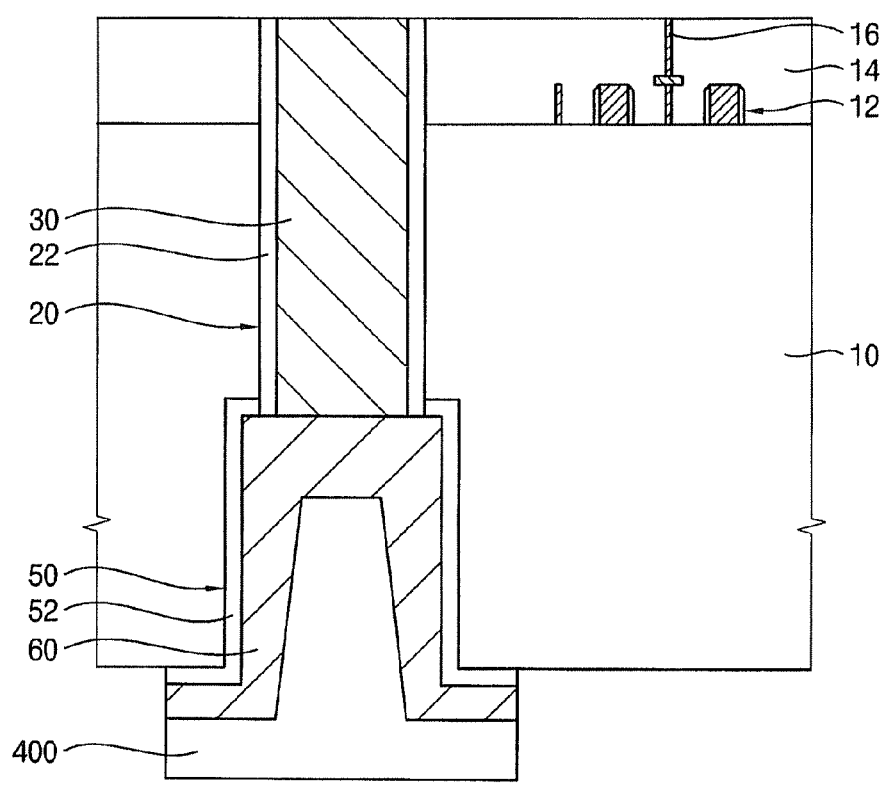

Referring to FIG. 26, the second plug 60 may be a conductive pattern having a recess extending into an upper portion thereof. The diameter of the recess may be gradually decreased as it extends into the upper portion, while the diameter of the second plug 60 may remain constant. A first bump 400 may be disposed within the recess of the second plug 60 so as to be connected to another external connection pad or plug.

Figure 27:
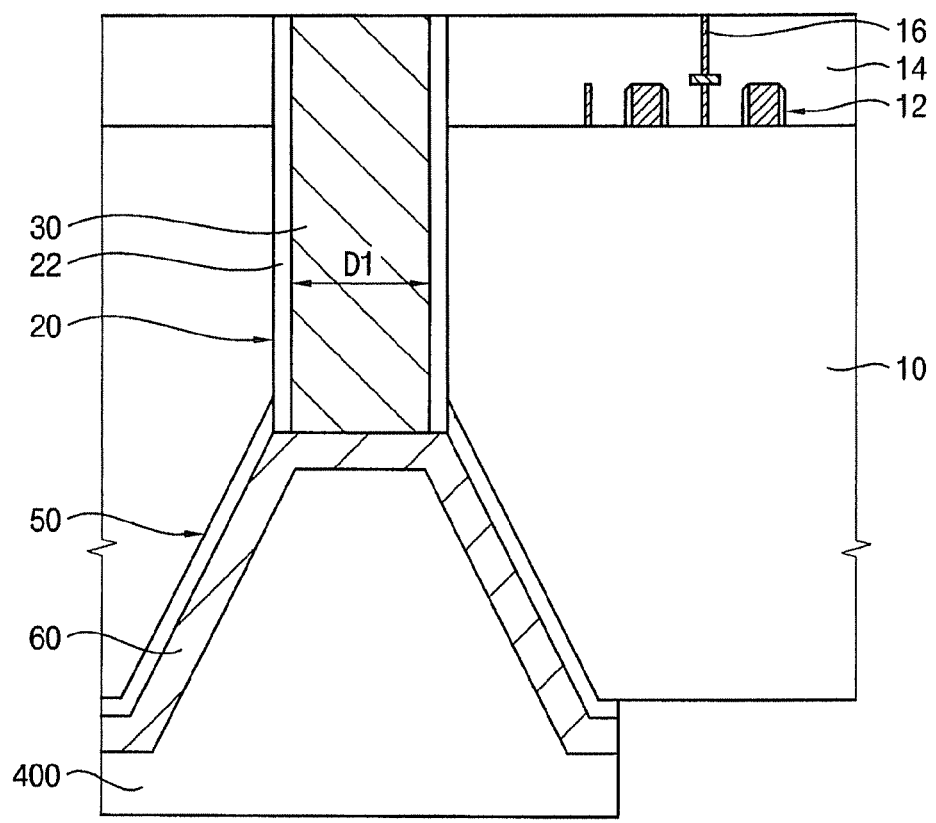

Referring to FIG. 27, the diameter of the second opening 50 may be gradually decreased from the second surface in a thickness direction of the substrate 10. The second plug 60 may be a conductive pattern that is formed conformally along the profile of the second opening 50 so as to only partially fill the second opening 50. As a result, the second plug 60 may have a recess extending into an upper portion thereof. A first bump 400 may be disposed within the recess of the second plug 60 so as to be connected to another external connection pad or plug.

Figure 28:
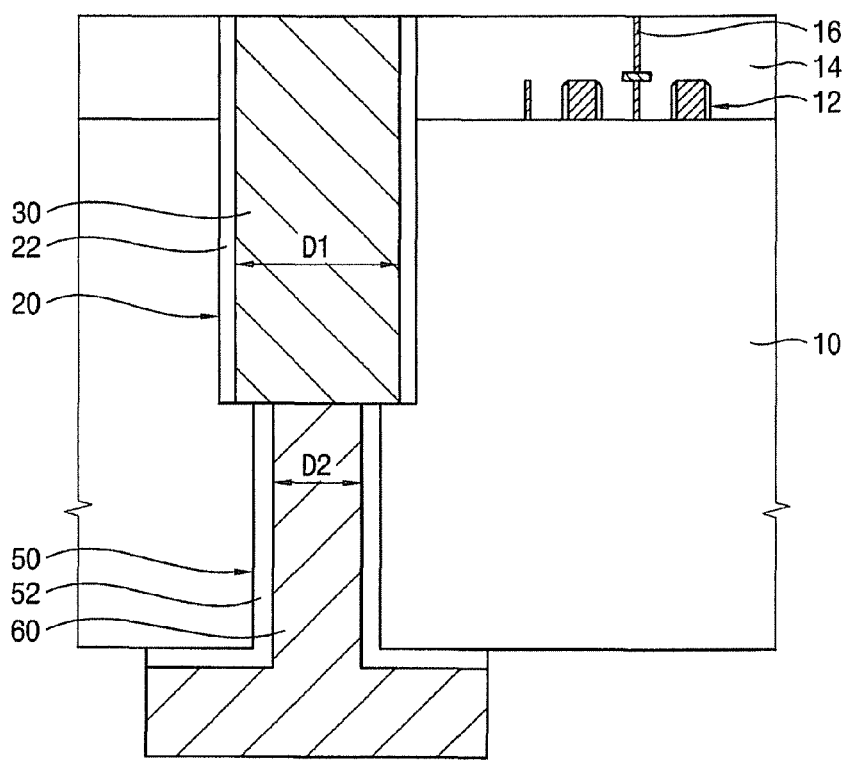

Referring to FIG. 28, the second plug 60 may have a second diameter (D2) that is smaller than a first diameter (D1) of the first plug 30. The second opening 50 may be formed to partially expose a lower surface of the first plug 30. The second plug 60 may be a conductive pattern that completely fills the second opening 50.

Figure 29:
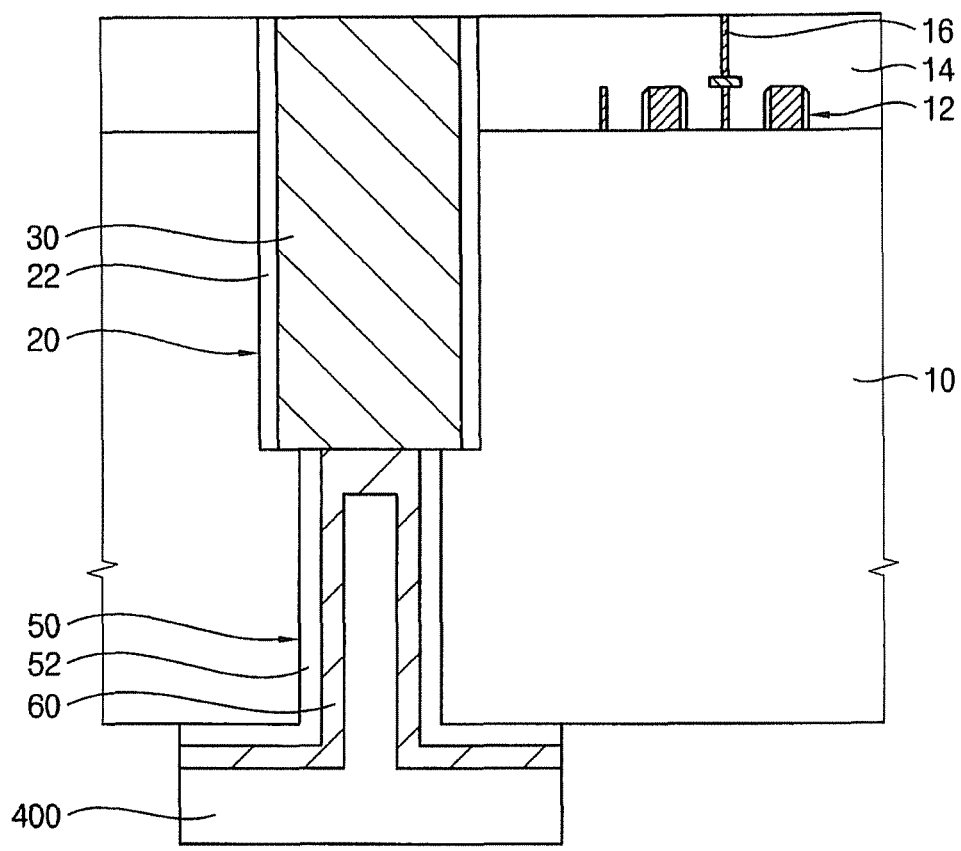

Referring to FIG. 29, the diameter of the second opening 50 may be smaller than the diameter of the first opening 20. Accordingly, the second opening 50 may partially expose a lower surface of the first plug 30. The second plug 60 may be a conductive pattern that is formed conformally along the profile of the second opening 50 so as to only partially fill the second opening 50. As a result, the second plug 60 may have a recess that extends into an upper portion thereof. A first bump 400 may be disposed within the recess of the second plug 60 so as to be connected to another external connection pad or plug.

In addition, although not illustrated, the diameter of the second opening 50 may be gradually decreased from the second surface in a thickness direction of the substrate 10. The second plug may also completely fill the second opening 50. Alternatively, the second plug 60 may be a conductive pattern that is formed conformally along the profile of the second opening 50 so as to only partially fill the second opening 50. As a result, the second plug may have a recess that extends into an upper portion thereof.

As mentioned above, in a method of manufacturing a semiconductor device in accordance with example embodiments, before or after a first plug is formed to extend from a first surface in a thickness direction of a substrate, a wiring process (BEOL process) may be performed to form an upper wiring layer including wirings that electrically connect the first plug to circuit patterns on the first surface of the substrate. A second plug may be formed to extend from the second surface in the thickness direction of the substrate to be connected to the first plug.

Accordingly, a thermal stress to a through electrode under a relatively high temperature of the BEOL process may be reduced. In addition, the resultant through electrode may be formed to have a desired length. Also, costs for forming the through electrode may be reduced. Furthermore, during the manufacturing processes, a conductive material such as copper may be prevented from diffusing into the substrate.

The foregoing is merely illustrative of example embodiments and is not to be construed as limiting thereof. Although a few examples have been described, those skilled in the art will readily appreciate that many modifications and variations are possible without materially departing from the novel teachings and advantages of the present invention. Accordingly, all such modifications and variations that would be readily appreciated by those ordinarily skilled in the art are intended to be included within the scope of example embodiments as defined in the claims. In the claims, means-plus-function clauses (if applicable) are intended to cover the structures described herein as performing the recited function and include not only structural equivalents but also equivalent structures. Therefore, it is to be understood that the foregoing is merely illustrative of various examples and is not to be construed as limited to the specific example embodiments disclosed, and that all obvious modifications and variations to the disclosed example embodiments are intended to be included within the scope of the appended claims.

What is claimed is:

1. A semiconductor device, comprising:
   a substrate having a first surface and a second surface opposite to the first surface, the substrate including circuit patterns on the first surface;
   a through electrode penetrating the substrate and electrically connected to the circuit patterns, the through electrode including a first plug and a second plug, the first plug extending from the first surface in a thickness direction of the substrate, the second plug extending from the second surface in the thickness direction of the substrate, the second plug connected to the first plug; and
   an upper wiring layer on the first surface of the substrate, the upper wiring layer configured to connect the circuit patterns to the first plug, the upper wiring layer including wirings that are electrically connected to the circuit patterns.

2. The semiconductor device of claim 1, wherein at least one of the wirings contacts an upper surface of the first plug.

3. The semiconductor device of claim 1, wherein the first plug penetrates the upper wiring layer.

4. The semiconductor device of claim 1, wherein the first plug has a first diameter, and the second plug has a second diameter that is greater than the first diameter.

5. The semiconductor device of claim 4, wherein the second diameter of the second plug tapers from the second surface in the thickness direction of the substrate.

6. The semiconductor device of claim 1, wherein the second plug includes a recess in an upper portion thereof.

7. A semiconductor device comprising:
   a substrate having a first surface and an opposing second surface;
   at least one circuit pattern on the first surface of the substrate;
   a first plug electrically connected to the at least one circuit pattern, the first plug extending from the first surface;
   a second plug extending from the second surface, the second plug electrically connected to the first plug, the second plug having a width that is greater than that of the first plug;
   an upper wiring layer on the first surface of the substrate, the upper wiring layer configured to connect the at least one circuit pattern to the first plug; and
   at least one wiring within the upper wiring layer, the at least one wiring electrically connecting the first plug and the at least one circuit pattern.

8. The semiconductor device of claim 7, further comprising:
   an insulation interlayer on the first surface of the substrate, the insulation interlayer covering the at least one circuit pattern.

9. The semiconductor device of claim 7, wherein the second plug has a diameter greater than that of the first plug.

10. The semiconductor device of claim 7, wherein the second plug has a diameter that tapers as the second plug extends from the second surface into the substrate.

11. The semiconductor device of claim 1, wherein an entirety of the upper wiring layer is above the circuit patterns and the through electrode.

* * * * *